United States Patent
Kim et al.

(10) Patent No.: US 9,640,264 B2
(45) Date of Patent: May 2, 2017

(54) MEMORY SYSTEM RESPONSIVE TO FLUSH COMMAND TO STORE DATA IN FAST MEMORY AND METHOD OF OPERATING MEMORY SYSTEM

(71) Applicant: Samsung Electronics Co., Ltd, Suwon-si, Gyeonggi-do (KR)

(72) Inventors: Nam-Ho Kim, Seoul (KR); Jun Kil Ryu, Seongnam-si (KR); Hongmoon Wang, Suwon-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 24 days.

(21) Appl. No.: 14/227,269

(22) Filed: Mar. 27, 2014

(65) Prior Publication Data

US 2014/0293712 A1 Oct. 2, 2014

(30) Foreign Application Priority Data

Apr. 1, 2013 (KR) ........................ 10-2013-0035283

(51) Int. Cl.
| | |
|---|---|
| *G11C 7/10* | (2006.01) |
| *G06F 3/06* | (2006.01) |
| *G11C 16/10* | (2006.01) |
| *G11C 11/56* | (2006.01) |
| *G06F 12/02* | (2006.01) |

(52) U.S. Cl.
CPC ............ *G11C 16/10* (2013.01); *G06F 3/0688* (2013.01); *G06F 12/0246* (2013.01); *G11C 11/5628* (2013.01); *G06F 2212/1032* (2013.01); *G06F 2212/7203* (2013.01)

(58) Field of Classification Search
CPC .................. G06F 2212/205; G06F 2212/1032
See application file for complete search history.

(56) References Cited

U.S. PATENT DOCUMENTS

| | | | | |
|---|---|---|---|---|
| 5,671,388 | A | * | 9/1997 | Hasbun ......................... 711/103 |
| 6,236,593 | B1 | | 5/2001 | Hong et al. |
| 7,395,390 | B2 | | 7/2008 | Chen |

(Continued)

FOREIGN PATENT DOCUMENTS

| | | |
|---|---|---|
| JP | 2009-076075 | 4/2009 |
| JP | 2010-238009 | 10/2010 |

(Continued)

OTHER PUBLICATIONS

Bruce Jacob, Spencer W. Ng, David T. Wang, Memory Systems Cache, DRAM, Disk, 2008, Elsevier Inc., 142.*

*Primary Examiner* — Midys Rojas
*Assistant Examiner* — Michelle Taeuber
(74) *Attorney, Agent, or Firm* — Muir Patent Law, PLLC

(57) ABSTRACT

A method of operating a memory system includes storing data received from an external device in a buffer memory of the memory system, programming the data stored in the buffer memory to a first storage area of a nonvolatile memory of the memory system in response to a mode of the memory system being in a guarantee mode and to a second storage area of the nonvolatile memory in response to the mode of the memory system being in other than the guarantee mode, and programming the data stored in the first storage area to the second storage area during an idle time.

21 Claims, 34 Drawing Sheets

(56) References Cited

U.S. PATENT DOCUMENTS

| | | |
|---|---|---|
| 7,761,652 B2* | 7/2010 | Kim et al. ............... 711/103 |
| 8,230,161 B2 | 7/2012 | Chu |
| 8,356,134 B2* | 1/2013 | Ito et al. ............... 711/103 |
| 2007/0088867 A1 | 4/2007 | Cho et al. |
| 2008/0024899 A1* | 1/2008 | Chu et al. ............... 360/69 |
| 2008/0209161 A1 | 8/2008 | Yun et al. |
| 2009/0083504 A1 | 3/2009 | Belluomini et al. |
| 2009/0182933 A1* | 7/2009 | Jang et al. ............... 711/103 |
| 2009/0316483 A1 | 12/2009 | Kim et al. |
| 2010/0042773 A1* | 2/2010 | Yeh ............... G06F 12/0804 711/103 |
| 2010/0169540 A1* | 7/2010 | Sinclair ............... 711/103 |
| 2010/0250885 A1 | 9/2010 | Nakata |
| 2011/0066808 A1 | 3/2011 | Flynn et al. |
| 2011/0126066 A1 | 5/2011 | Jo et al. |
| 2012/0072650 A1* | 3/2012 | Suzumura et al. ............... 711/103 |
| 2012/0079171 A1* | 3/2012 | Ju et al. ............... 711/103 |
| 2014/0143476 A1* | 5/2014 | Sela ............... G06F 3/0619 711/103 |

FOREIGN PATENT DOCUMENTS

| | | |
|---|---|---|
| KR | 10-0330164 | 3/2002 |
| KR | 10-0673013 | 1/2007 |
| KR | 10-2007-0060301 | 6/2007 |
| KR | 10-0882740 | 2/2009 |
| KR | 10-2009-0132878 | 12/2009 |
| KR | 10-2011-0058028 | 6/2011 |
| KR | 10-2012-0033372 | 4/2012 |
| KR | 10-2012-0045421 | 5/2012 |
| KR | 10-2012-0090965 | 8/2012 |

\* cited by examiner

| Logical Address | Physical Address |
|---|---|
|  |  |
|  |  |
|  |  |
|  |  |
|  |  |
| ⋮ | ⋮ |
|  |  |

Fig. 8

|  | 1-Step PGM | Coarse PGM | Fine PGM |
|---|---|---|---|
| WL8 | 19 | ... | ... |
| WL7 | 16 | 20 | ... |
| WL6 | 13 | 17 | 21 |
| WL5 | 10 | 14 | 18 |
| WL4 | 7 | 11 | 15 |
| WL3 | 4 | 8 | 12 |
| WL2 | 2 | 5 | 9 |
| WL1 | 1 | 3 | 6 |

| | PGM |
|---|---|
| WL8 | 8 |
| WL7 | 7 |
| WL6 | 6 |
| WL5 | 6 |
| WL4 | 5 |
| WL3 | 3 |
| WL2 | 2 |
| WL1 | 1 |

Fig. 16

| Logical Address | Physical Address |
|---|---|
| LA_1_3 | PA_113_1 |
|  |  |
|  |  |
|  |  |
|  |  |
| ⋮ | ⋮ |
|  |  |

| Logical Address | Physical Address |
|---|---|
| LA_1_3 | PA_113_1 |
| LA_4_6 | PA_111_1_3 |
| LA_7_9 | PA_111_4_6 |
| LA_10_12 | PA_111_7_9 |
| LA_13_15 | PA_111_10_12 |
| ⋮ | ⋮ |
|  |  |

| Logical Address | Physical Address |   |
|---|---|---|
| LA_1_3 | PA_113_1 |   |
| LA_4_6 | PA_113_2 | ←— S325 |
| LA_7_9 | PA_113_3 | ←— S331 |
| LA_10_12 | PA_111_7_9 |   |
| LA_13_15 | PA_111_10_12 |   |
| ⋮ | ⋮ |   |
|   |   |   |

Fig. 26

| Logical Address | Physical Address |
|---|---|
| LA_1_3 | PA_113_1 |
| LA_4_6 | PA_113_2 |
| LA_7_9 | PA_113_3 |
| LA_10_12 | PA_113_4 | ← S339
| LA_13_15 | PA_111_10_12 |
| ⋮ | ⋮ |
|  |  |

Option 1 — Release data except data associated with reprogram

Option 2 — Release data except data associated with reprogram and additional data Option 3 — Do not release data and check data stored in first type area

MEMORY SYSTEM RESPONSIVE TO FLUSH COMMAND TO STORE DATA IN FAST MEMORY AND METHOD OF OPERATING MEMORY SYSTEM

CROSS-REFERENCE TO RELATED APPLICATIONS

This application claims the benefit of priority under 35 U.S.C. §119 to Korean Patent Application No. 10-2013-0035283, filed Apr. 1, 2013, in the Korean Intellectual Property Office, the content of which is incorporated herein in its entirety by reference.

BACKGROUND

1. Field

An embodiment of the inventive concept described herein relates to a semiconductor memory, and more particularly, relates to a memory system including a semiconductor memory and a method of operating the memory system.

2. Description of the Related Art

A semiconductor memory device is a memory device which is fabricated using semiconductors such as silicon (Si), germanium (Ge), gallium arsenide (GaAs), indium phosphide (InP), and the like. Semiconductor memory devices are classified into volatile memory devices and nonvolatile memory devices.

The volatile memory devices may lose stored contents after a power-off. The volatile memory devices include a static random-access memory (RAM) (SRAM), a dynamic RAM (DRAM), a synchronous DRAM (SDRAM), etc. The nonvolatile memory devices may retain stored contents even after a power-off. The nonvolatile memory devices include a read only memory (ROM), a programmable ROM (PROM), an electrically programmable ROM (EPROM), an electrically erasable and programmable ROM (EEPROM), a flash memory device, a phase-change RAM (PRAM), a magnetic RAM (MRAM), a resistive RAM (RRAM), a ferroelectric RAM (FRAM), etc.

Semiconductor memory is used with a memory controller that is configured to control the semiconductor memory. The memory controller is configured to control read, write, erase, and background operations of the semiconductor memory. The memory controller includes various operating methods of controlling the semiconductor memory to improve an operating performance of the semiconductor memory.

SUMMARY

The present inventive concept provides a method of operating a memory system.

The present inventive concept also provides a specific memory system.

Additional features and utilities of the present general inventive concept will be set forth in part in the description which follows and, in part, will be obvious from the description, or may be learned by practice of the general inventive concept.

The present inventive concept provides a method of operating a memory system that includes storing data received from an external device in a buffer memory of the memory system, programming the data stored in the buffer memory to a first storage area of a nonvolatile memory of the memory system in response to a mode of the memory system being in a guarantee mode and to a second storage area of the nonvolatile memory in response to the mode of the memory system being in other than the guarantee mode, and programming the data stored in the first storage area to the second storage area during an idle time, wherein the memory system is set to the guarantee mode in response to a flush command being transmitted from the external device.

In an embodiment, the first storage area may be a single level cell memory area and the second storage area may be a multi-level cell memory area.

In an embodiment, the first storage area may be a fast low-capacity memory and the second storage area may be a slow large-capacity memory.

In an embodiment, in response to the data stored in the buffer memory being programmed to the first storage area, mapping information associated with the data may be updated to indicate an address of the first storage area, and in response to the data stored in the buffer memory being programmed to the second storage area, the mapping information associated with the data may be updated to indicate an address of the second storage area.

In an embodiment, in response to an end of the programming the data stored in the buffer memory in the first storage area, the guarantee mode may end.

In an embodiment, the mode of the memory system may be set to the guarantee mode in response to a cache off signal being transmitted from the external device.

In an embodiment, during the guarantee mode, the data remaining in the buffer memory, other than the data associated with a first program operation of the second storage area, may be released from the buffer memory, after an end of the programming the data stored in the buffer memory to the first storage area of the nonvolatile memory.

In an embodiment, the first program operation may be performed based on the data remaining in the buffer memory and associated with the first program operation, in the event that, during the guarantee mode, the programming the data stored in the buffer memory to the second storage area of the nonvolatile memory occurs after the end of the programming the data stored in the buffer memory to the first storage area of the nonvolatile memory.

In an embodiment, in response to an end of the first program operation of the second storage area and an absence of data received from the external device, after the programming the data stored in the buffer memory to the first storage area of the nonvolatile memory during the guarantee mode, the data programmed in the first storage area may be loaded into the buffer memory and a second program operation of the second storage area is performed based on the data loaded into the buffer memory.

In an embodiment, if a storage space of the first storage area is insufficient when the data stored in the buffer memory is programmed to the first storage area of the nonvolatile memory during the guarantee mode, a garbage collection operation of the first storage area may be performed.

In an embodiment, if a storage space of the first storage area is insufficient when the data stored in the buffer memory is programmed to the first storage area of the nonvolatile memory during the guarantee mode, the data programmed to the first storage area may be programmed to the second storage area, the data programmed to the first storage area may be invalidated, and a garbage collection operation of the first storage area may be performed.

In an embodiment, if a storage space of the first storage area is insufficient when the data stored in the buffer memory is programmed to the first storage area of the nonvolatile memory during the guarantee mode, the programming the data stored in the buffer memory to the first storage area of the nonvolatile memory may be skipped.

The foregoing and/or other features and utilities of the present inventive concept also provide a memory system that includes a buffer memory configured to store data received from an external device, a nonvolatile memory including a first storage area and a second storage area, and a memory controller configured to program the data stored in the buffer memory to the second storage area. In response to a flush command received from the external device, the memory controller is further configured to program the data stored in the buffer memory to the first storage area. The memory controller is further configured to program the data in the first storage area to the second storage area during an idle time.

In an embodiment, the first storage area may be a fast low-capacity memory and the second storage area may be a slow large-capacity memory.

In an embodiment, the buffer memory, the nonvolatile memory, and the memory controller may constitute a solid state drive.

The foregoing and/or other features and utilities of the present inventive concept also provide a non-transitory computer-readable recording medium containing instructions which, when executed by an electronic processing element, cause the electronic processing element to perform a method of operating a memory system that includes storing data received from an external device in a buffer memory of the memory system, programming the data stored in the buffer memory to a first storage area of a nonvolatile memory of the memory system in response to a mode of the memory system being in a guarantee mode and to a second storage area of the nonvolatile memory in response to the mode of the memory system being in other than the guarantee mode, and programming the data stored in the first storage area to the second storage area during an idle time, wherein the memory system is set to the guarantee mode in response to a flush command being transmitted from the external device.

The foregoing and/or other features and utilities of the present inventive concept also provide a memory system that includes a buffer memory configured to store data received from an external device, a nonvolatile memory having a fast processing area and a large capacity area, and a memory controller configured to program the data in the buffer memory to the fast processing area in response to being in a guarantee mode, to program the data in the buffer memory to the large capacity area in response to being in other than the guarantee mode, and to program the data in the fast processing area to the large capacity area during an idle time. The memory system may be configured to be set to the guarantee mode in response to receipt of a flush command.

In an embodiment, the memory system may be configured to perform a garbage collection operation of the fast processing area if a storage space of the fast processing area is insufficient during the guarantee mode.

In an embodiment, the memory system may be configured to program the data of the fast processing area to the large capacity area if a storage space of the fast processing area is insufficient during the guarantee mode.

In an embodiment, the memory system may be configured to skip programming the data in the buffer memory to the fast processing area if a storage space of the fast processing area is insufficient during the guarantee mode.

In an embodiment of the present inventive concept, data stored in a buffer memory may be directly stored in a large-capacity nonvolatile memory. During a guarantee mode, a memory system may back up the data stored in the buffer memory to a fast nonvolatile memory. The backed-up data may be copied to the large-capacity nonvolatile memory during an idle time. An updating frequency of a mapping table to manage a nonvolatile memory may be reduced, and validity of the data may be secured. Thus, it may be possible to improve an operating performance.

BRIEF DESCRIPTION OF THE DRAWINGS

These and/or other features and utilities of the present general inventive concept will become apparent and more readily appreciated from the following description of the embodiments, taken in conjunction with the accompanying drawings of which:

FIG. 7 illustrates a mapping table according to an embodiment of the present inventive concept;

FIG. 8 includes a table that illustrates a program sequence of a second type area of a nonvolatile memory, according to an embodiment of the present inventive concept;

FIG. 16 illustrates a mapping table updated at a program operation described with reference to FIGS. 14 and 15, according to an embodiment of the present inventive concept;

FIG. 20 illustrates a mapping table updated at a program operation described with reference to FIGS. 18 and 19, according to an embodiment of the present inventive concept;

FIG. 23 illustrates a mapping table updated during a program operation illustrated in FIGS. 21 and 22, according to an embodiment of the present inventive concept;

FIG. 26 illustrates a mapping table updated during a program operation described with reference to FIGS. 24 and 25, according to an embodiment of the present inventive concept;

FIG. 27 includes a diagram that illustrates an example of a method of managing data stored in a buffer memory after a flush operation;

DETAILED DESCRIPTION OF THE EMBODIMENTS

Figure 1:
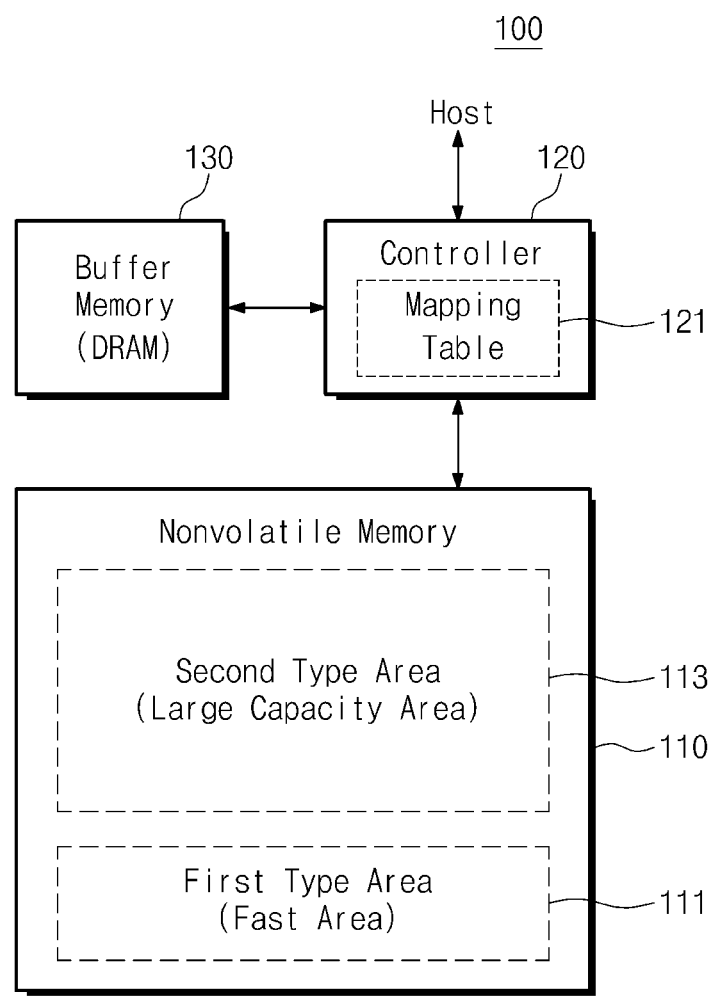
FIG. 1 is a block diagram schematically illustrating a memory system according to an embodiment of the present inventive concept.

Reference will now be made in detail to the embodiments of the present general inventive concept, examples of which are illustrated in the accompanying drawings, wherein like reference numerals refer to the like elements throughout. The embodiments are described below in order to explain the present general inventive concept while referring to the figures.

The present inventive concept, however, may be embodied in various different forms, and should not be construed as being limited only to the illustrated embodiments. Rather, these embodiments are provided as examples so that this disclosure will be thorough and complete, and will fully convey the concept of the present inventive concept to those skilled in the art. Accordingly, known processes, elements, and techniques are not described with respect to some of the embodiments of the present inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the present inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a block diagram schematically illustrating a memory system 100 according to an embodiment of the present inventive concept. Referring to FIG. 1, the memory system 100 includes a nonvolatile memory 110, a controller 120, and a buffer memory 130.

The nonvolatile memory 110 may include a flash memory, a Phase-change Random-Access Memory (RAM) (PRAM), a Magnetic RAM (MRAM), a Resistive RAM (RRAM), a Ferroelectric RAM (FRAM), etc. It is assumed that the nonvolatile memory 110 is a NOT AND (NAND) logic gate architecture flash memory (NAND flash memory). However, the present inventive concept is not limited thereto.

The nonvolatile memory 110 includes a first type area 111 and a second type area 113. Each of the first and second type areas 111 and 113 may include a plurality of memory blocks (not illustrated). Each memory block may include a plurality of memory cells (not illustrated). Rows of memory cells in each memory block may be connected to word lines (not illustrated), and columns thereof may be connected to bit lines (not illustrated).

The first type area 111 may be a fast area, and the second type area 113 may be a large capacity area. For example, the first type area 111 may include memory cells, used as Single Level Cells (SLCs), from among the memory cells of the nonvolatile memory 110. The second type area 113 may include memory cells, used as Multi-Level Cells (MLCs) or Triple Level Cells (TLCs), from among the memory cells of the nonvolatile memory 110. The first type area 111 and the second type area 113 may be integrated in the same semiconductor chip (not illustrated).

A single level cell may be a memory cell that stores a bit, a multi-level cell may be a memory cell that stores two or more bits, and a triple level cell may be a memory cell that stores three bits. The single level cell, the multi-level cell, and the triple level cell may have the same structure. The single level cell, the multi-level cell, and the triple level cell may be classified according to methods of use.

Triple level cells may be connected to a word line to form three pages. A first bit stored in each triple level cell may be a Least Significant Bit (LSB). LSBs of triple level cells may form an LSB page. Data stored in the LSB page may be referred to as LSB page data. A second bit stored in each triple level cell may be a Central Significant Bit (CSB). CSBs of triple level cells may form a CSB page. Data stored in the CSB page may be referred to a CSB page data. A third bit stored in each triple level cell may be a Most Significant Bit (MSB). MSBs of triple level cells may form an MSB page. Data stored in the MSB page may be referred to as MSB page data.

The controller 120 may be configured to control the nonvolatile memory 110 and the buffer memory 130. The controller 120 may drive a mapping table 121 to manage the nonvolatile memory 110. The mapping table 121 may store information associated with a correlation between logical addresses used by an external device (e.g., a host) and physical addresses used by the nonvolatile memory 110. For example, the mapping table 121 may store mapping information between logical addresses and physical addresses. The controller 120 may convert a logical address received from the external device into a physical address.

The mapping table 121 may be stored in the first type area 111. At power-on, the controller 120 may read the mapping table 121 from the first type area 111 and may load the read mapping table 121 onto the buffer memory 130 or an internal memory (not illustrated). The controller 120 may drive the loaded mapping table 121, and may back up the mapping table 121 to the first type area 111 periodically or in response to detection of updating of the mapping table 121.

The buffer memory 130 may be a working memory of the memory system 100. The buffer memory 130 may store data received from the external device (not illustrated), data read from the nonvolatile memory 110, and a variety of data (e.g., metadata, codes, etc.) required to drive the memory system 100. The buffer memory 130 may include at least one of random access memories (RAM) such as, for example, a Static RAM (SRAM), a Dynamic RAM (DRAM), a Synchronous DRAM (SDRAM), a Phase-change RAM (PRAM), a Magnetic RAM (MRAM), a Resistive RAM (RRAM), a Ferroelectric RAM (FRAM), etc. For ease of description, it is assumed that the buffer memory 130 is formed as a DRAM. However, the present inventive concept is not limited thereto.

In embodiments of the present inventive concept, the nonvolatile memory 110, the controller 120, and the buffer memory 130 may be packed by different semiconductor packages. The nonvolatile memory 110, the controller 120, and the buffer memory 130 may be formed as different semiconductor chips. The controller 120 and the buffer memory 130 may be, for example, integrated in a semiconductor package to form a multi-chip package. The controller 120 and the buffer memory 130 may be configured, for example, to form a package-on-package.

Figure 2:
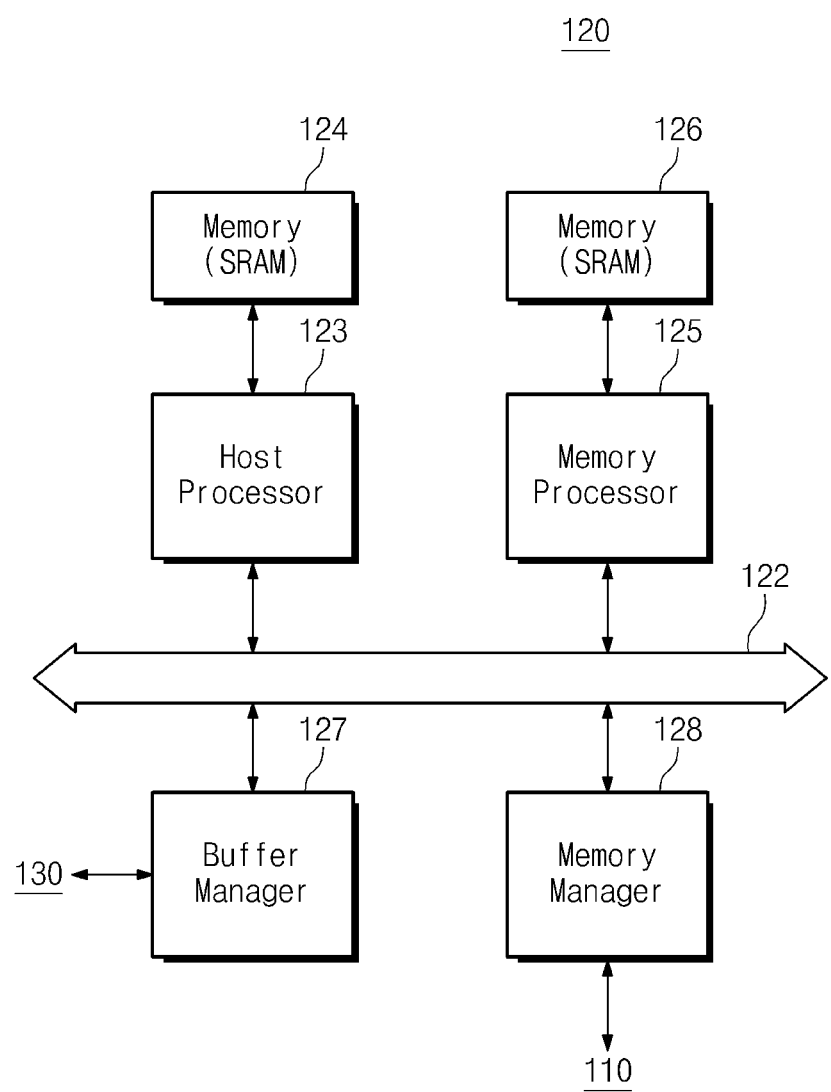
FIG. 2 is a block diagram schematically illustrating a controller according to an embodiment of the present inventive concept.

FIG. 2 is a block diagram schematically illustrating the controller 120 according to an embodiment of the present inventive concept. Referring to FIGS. 1 and 2, the controller 120 may include a bus 122, a host processor 123, a first memory 124, a memory processor 125, a second memory 126, a buffer manager 127, and a memory manager 128.

The bus 122 may provide a channel among components of the controller 120.

The host processor 123 may be configured to perform a control operation associated with the external device (e.g., a host) (not illustrated). For example, the host processor 123 may communicate with the external device. The host processor 123 may transfer a command or an address received from the external device to the memory processor 125. The host processor 123 may store, data received from the external device in the buffer memory 130 (see FIG. 1) through the buffer manager 127. The host processor 123 may transfer an interrupt signal to the memory processor 125 according to a special command or a special state signal received from the external device.

The first memory 124 may be a working memory of the host processor 123. The host processor 123 may use the first memory 124 as, for example, a cache memory, a buffer memory, a temporary memory, etc.

The memory processor 125 may be configured to perform a control operation associated with the nonvolatile memory 110 (see FIG. 1). For example, the memory processor 125 may sequentially process a command received from the host processor 123. The memory processor 125 may control the memory manager 128 such that a read, write, or erase command may be transferred to the nonvolatile memory 110 according to a command. The memory processor 125 may control the memory manager 128 such that data may be transferred to the nonvolatile memory 110 according to a command.

The memory processor 125 may control various background operations for managing the nonvolatile memory 110. For example, the memory processor 125 may control background operations such as, for example, garbage collection, status read, read reclaim, etc. The garbage collection operation may include an operation that collects valid data of the nonvolatile memory 110 and stores the collected valid data in a new memory block (not illustrated). The garbage collection operation may further include an operation of that erases a memory block in which invalid data may be stored. The status read operation may include an operation that checks a deterioration or wear level of memory cells of the nonvolatile memory 110. The read reclaim operation may include an operation that moves data, stored in memory cells that have a reduced data retention characteristic, into other memory cells.

The memory processor 125 may drive a mapping table 121 (see FIG. 1). The memory processor 125 may perform a logical address-to-physical address conversion and a physical address-to-logical address conversion based on the mapping table 121.

The memory processor 125 may process an interrupt signal transferred from the host processor 123. For example, in response to receipt of an interrupt signal from the host processor 123, the memory processor 125 may process the received interrupt signal prior to another command.

The second memory 126 may be a working memory of the memory processor 125. The memory processor 125 may use the second memory 126 as, for example, a cache memory, a buffer memory, a temporary memory, etc. For example, the second memory 126 may be used as a command queue that stores a command transferred from the host processor 123.

The buffer manager 127 may control the buffer memory 130 (see FIG. 1) according to a request of the host processor 123 or the memory processor 125. The buffer manager 127 may control read and write operations of the buffer memory 130.

The memory manager 128 may control the nonvolatile memory 110 (see FIG. 1) according to a request of the memory processor 125. The memory manager 128 may control a read, write, or erase operation of the nonvolatile memory 110 in response to a command from the memory processor 125. The memory manager 128 may include a command queue that stores a command transferred from the memory processor 125.

In embodiments of the present inventive concept, the host processor 123 and the memory processor 125 may operate independently. In response to receipt of a command from the external device, the host processor 123 may transfer the received command to the memory processor 125. In response to receipt of data from the external device, the host processor 123 may store the received data in the buffer memory 130 (see FIG. 1). The memory processor 125 may store a command provided from the host processor 123 in a storage device (not illustrated) such as, for example, a command queue and may sequentially process commands stored in the command queue.

Figure 3:
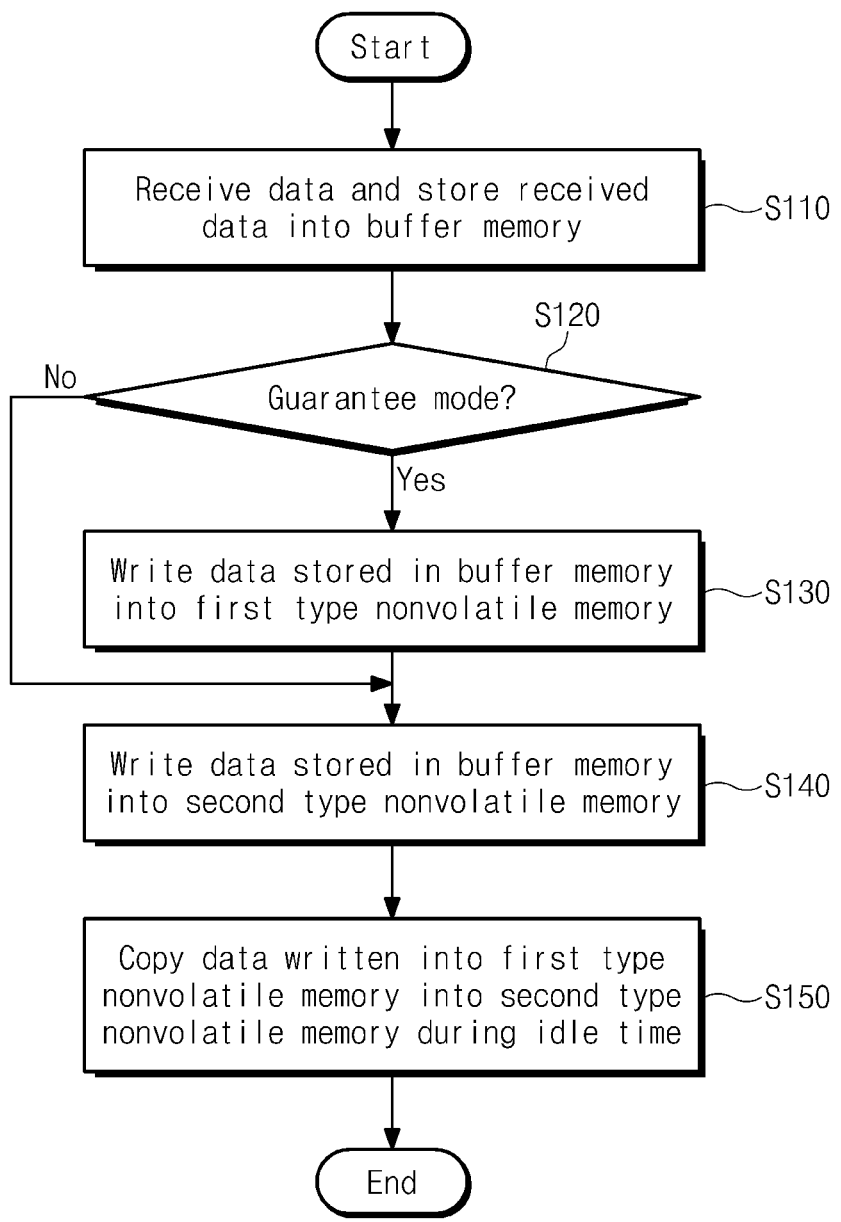
FIG. 3 is a flow chart illustrating a method of operating a memory system according to an embodiment of the present inventive concept.

FIG. 3 is a flow chart illustrating a method of operating the memory system 100 according to an embodiment of the present inventive concept. FIG. 3 illustrates a method in which the memory system 100 writes data in the nonvolatile memory 110.

Referring to FIGS. 1 to 3, in an operation S110, data may be received from an external device (e.g., a host), and the received data may be stored in the buffer memory 130. The operation S110 may be performed by the controller 120. For example, the operation S110 may be performed by the host processor 123 of the controller 120.

In an operation S120, a determination as to whether a mode of the memory system 100 is a guarantee mode may be performed. For example, the memory system 100 may be set to a guarantee mode or a normal mode according to a command or a state signal received from the external device. In response to a mode of the memory system 100 being the guarantee mode, the method may proceed to an operation S130. In response to a mode of the memory system 100 not being the guarantee mode, the method may proceed to an operation S140.

In the operation S130, data stored in the buffer memory 130 may be written to a first type nonvolatile memory. The first type nonvolatile memory may be, for example, a fast memory. The first type nonvolatile memory may be, for example, the first type area 111 of the nonvolatile memory 110.

In the operation S140, data stored in the buffer memory 130 may be written to a second type nonvolatile memory. The second type nonvolatile memory may be, for example, a large capacity memory. The second type nonvolatile memory may be, for example, the second type area 113 of the nonvolatile memory 110.

In an operation S150, data written to the first type nonvolatile memory may be copied to the second type nonvolatile memory during an idle time.

In embodiments of the present inventive concept, the operation S110 may be independent from the operations S120 to S150. The operation S110 may be performed, for example, by the host processor 123. The operations S120 to S150 may be performed, for example, by the memory processor 125. The host processor 123 may perform the operation S110 in response to receipt of data from the external device. In the event that data may be stored in the buffer memory 130, the memory processor 125 may iteratively perform the operations S120 to S150. If data written to the first type nonvolatile memory does not exist, the operation S150 may be skipped.

Figure 4:
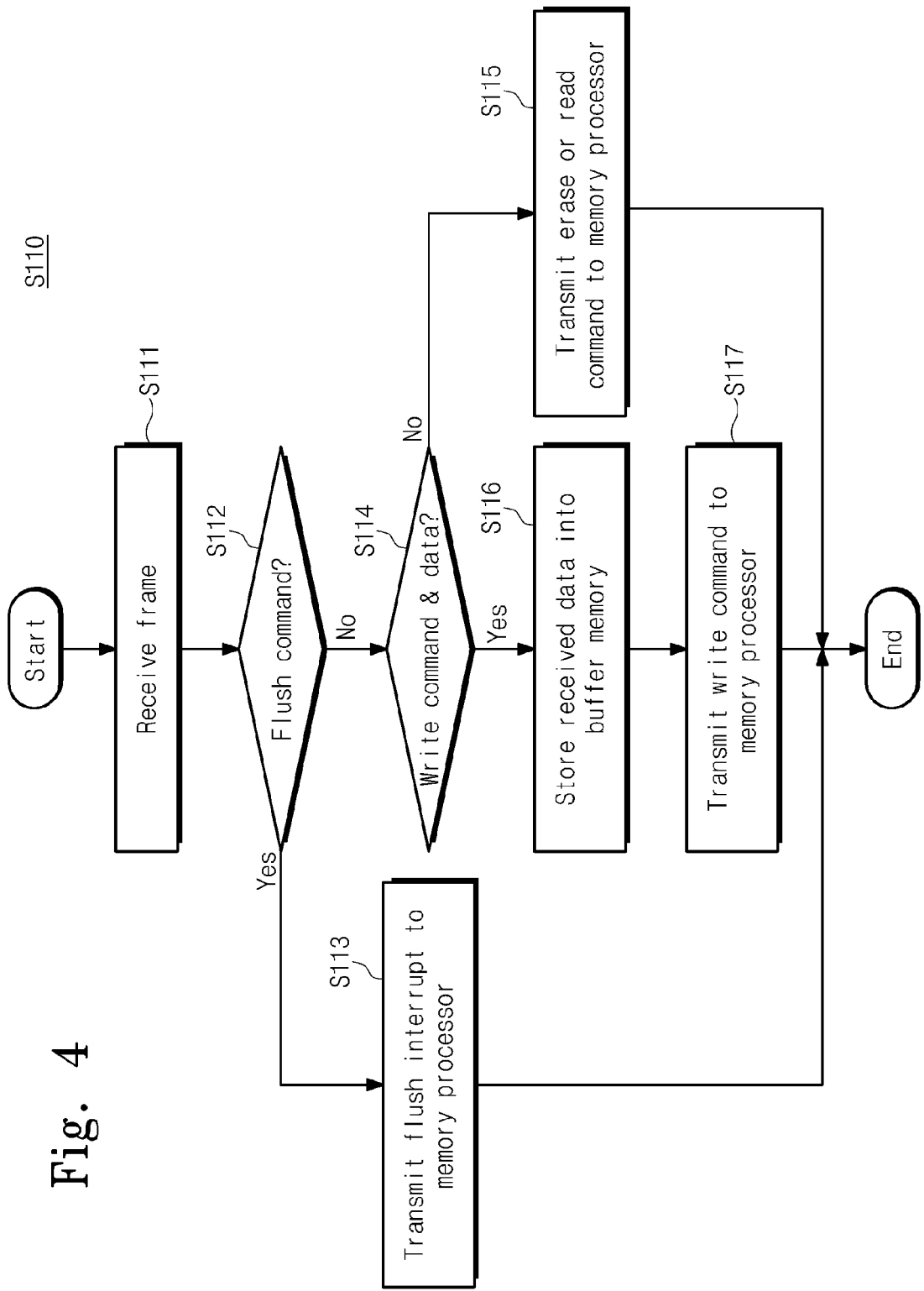
FIG. 4 is a detailed flow chart of operation S110 illustrated in FIG. 3, according to an embodiment of the present inventive concept.

FIG. 4 is a detailed flow chart of the operation S110 illustrated in FIG. 3, according to an embodiment of the present inventive concept. Referring to FIGS. 1 to 4, in an operation S111, a host processor 123 may receive a frame.

For example, a frame based on the Serial Advanced Technology Attachment (SATA) protocol may be received.

In an operation S112, a determination as to whether the received frame includes a flush command may be performed. If the received frame includes the flush command, in an operation S113, the host processor 123 may transmit a flush interrupt signal to the memory processor 125. If the received frame does not include the flush command, the method may proceed to an operation S114.

In the operation S114, a determination as to whether the received frame includes a write command and data may be performed. If the received frame does not include the write command and data, the received frame may include a read or erase command. Thus, in an operation S115, the host processor 123 may transmit the erase or read command to the memory processor 125.

If the received frame includes the write command and data, in an operation S116, the host processor 123 may store the received data in the buffer memory 130. In an operation S117, the host processor 123 may transmit the write command to the memory processor 125.

Figure 5:
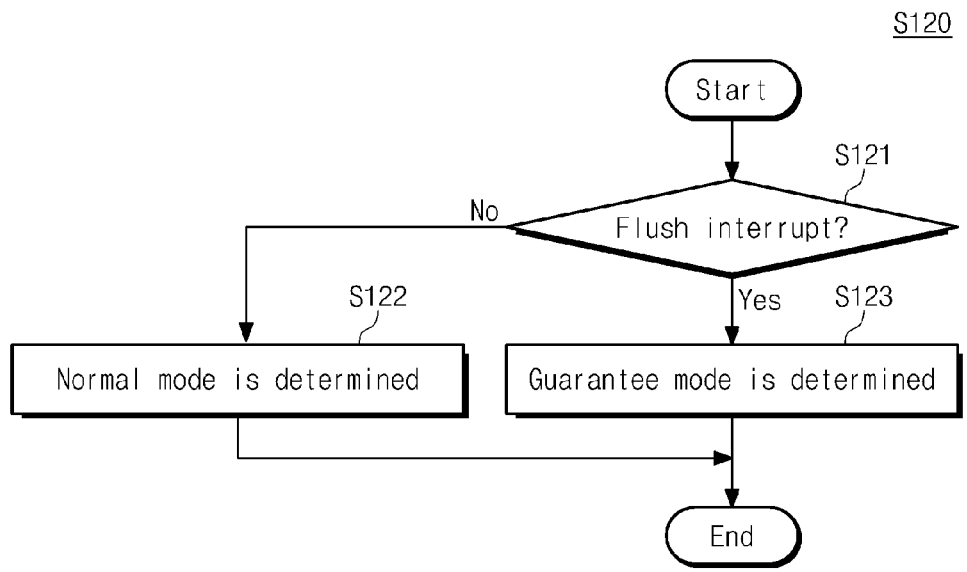
FIG. 5 is a detailed flow chart of operation S120 illustrated in FIG. 3, according to an embodiment of the present inventive concept.

FIG. 5 is a detailed flow chart of the operation S120 illustrated in FIG. 3, according to an embodiment of the present inventive concept. Referring to FIGS. 1 to 3 and 5, in an operation S121, the memory processor 125 may determine whether a flush interrupt signal is received. If the flush interrupt signal is not received, in an operation S122, a determination of a normal mode of operation may be performed. If the flush interrupt signal is received, in an operation S123, a determination of a guarantee mode of operation may be performed.

Figure 6:
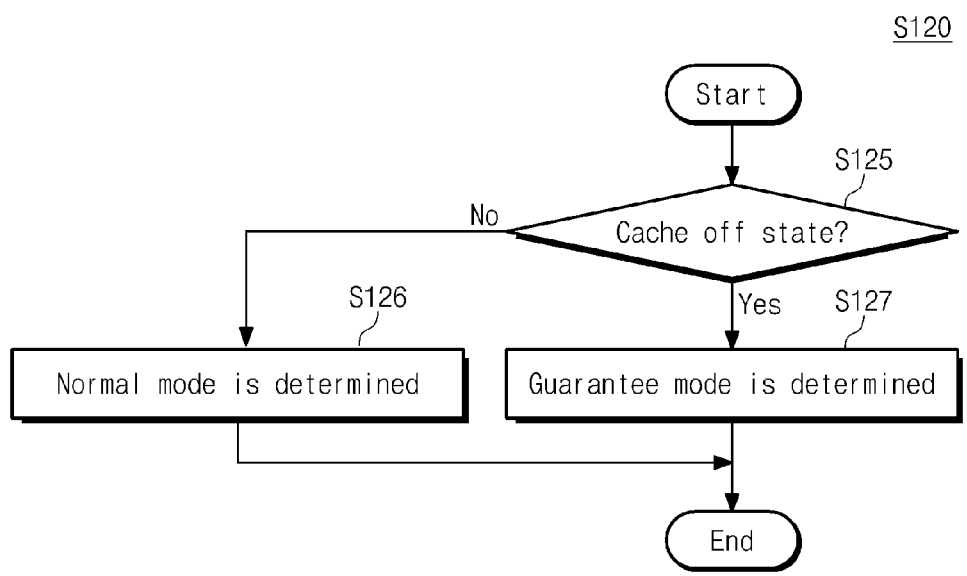
FIG. 6 is a detailed flow chart of operation S120 illustrated in FIG. 3, according to another embodiment of the present inventive concept.

FIG. 6 is a detailed flow chart of the operation S120 illustrated in FIG. 3, according to another embodiment of the present inventive concept. Referring to FIGS. 1 to 3 and 5, in an operation S125, a determination as to whether a cache off state is set may be performed. The cache off state may indicate, for example, a state in which a cache is not used for a guarantee. The cache off set may be set according to a state signal received from an external device (e.g., a host). In response to being in the cache off state, in an operation S126, a determination of a normal mode of operation may be performed. In response to not being in the cache off state, in an operation S127, a determination of a guarantee mode of operation may be performed.

FIG. 7 illustrates the mapping table 121 according to an embodiment of the present inventive concept. Referring to FIGS. 1 and 7, the mapping table 121 may include a logical address field and a physical address field. A logical address received from an external device (e.g., a host) may be recorded in the logical address field. A physical address of the nonvolatile memory 110 may be recorded in the physical address field.

For example, in response to a write operation to the nonvolatile memory 110 being performed, a logical address received from an external device (e.g., a host) may be recorded in the logical address field. Memory cells (not illustrated) of the nonvolatile memory 110 in which data is to be written may be selected, and the selected memory cells may be programmed. In response to completion of programming of the selected memory cells, a physical address of the selected memory cells may be recorded in the physical address field.

In response to a read operation of the nonvolatile memory 110 being performed, a logical address may be received from the external device. The input logical address may be converted into a physical address based on the mapping table 121. Memory cells of the nonvolatile memory 110 selected according to the converted physical address may be read.

FIG. 8 includes a table that illustrates a program sequence of the second type area 113 of the nonvolatile memory 110, according to an embodiment of the present inventive concept. For the explanation that follows, and not by way of limitation, it is assumed that the second type area 113 includes Triple Level Cells (TLCs). However, the present inventive concept is not limited thereto.

In embodiments of the present inventive concept, the second type area 113 may include a plurality of memory blocks (not illustrated). A program sequence illustrated in FIG. 8 may correspond to one of the memory blocks.

Referring to FIGS. 1 and 8, a 1-step program operation of a word line WL1 may be performed, a 1-step program operation of a word line WL2 may be performed, a coarse program operation of the word line WL1 may be performed, a 1-step program operation of a word line WL3 may be performed, a coarse program operation of the word line WL2 may be performed, and a fine program operation of the word line WL1 may be performed.

The 1-step program operation, the coarse program operation, and the fine program operation may be, for example, sequentially performed on a predetermined word line. For example, the 1-step program operation on an upper word line of the predetermined word line may be performed before the coarse program operation on the predetermined word line is performed. For example, the coarse program operation on the upper word line of the predetermined word line may be performed before the fine program operation on the predetermined word line is performed.

Figure 9:
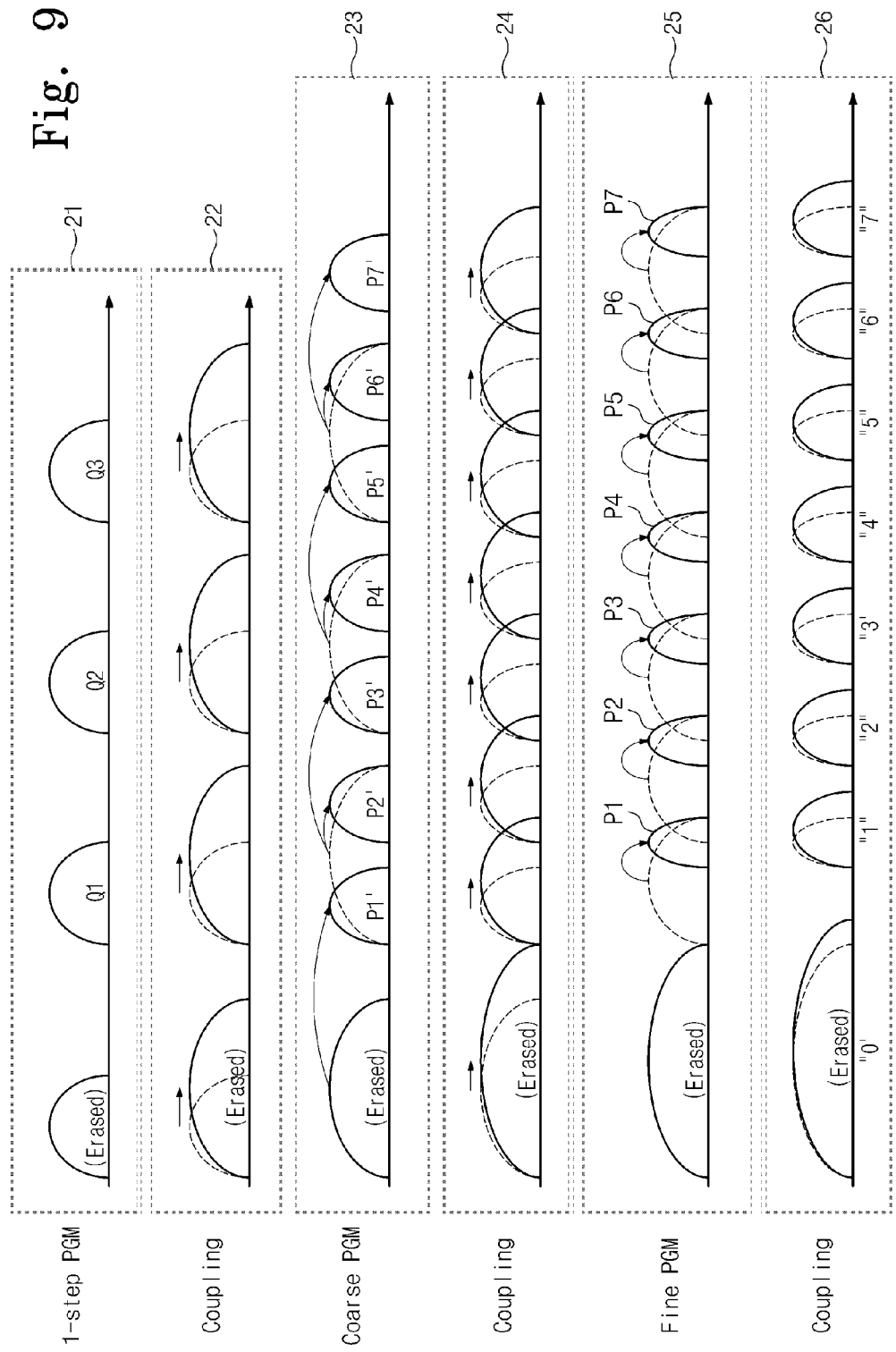
FIG. 9 includes graphs that illustrate variations in threshold voltages of memory cells associated with performance of a 1-step program operation, a coarse program operation, and a fine program operation, according to an embodiment of the present inventive concept.

FIG. 9 includes graphs that illustrate variations in threshold voltages of memory cells associated with performance of a 1-step program operation, a coarse program operation, and a fine program operation, according to an embodiment of the present inventive concept. In FIG. 9, a horizontal axis indicates threshold voltages of memory cells, and a vertical axis indicates the number of memory cells. That is, FIG. 9 illustrates threshold voltage distributions of memory cells.

Referring to FIG. 8 and a reference numeral '21' illustrated in FIG. 9, a 1-step program operation on a word line WL1 may be performed. In response to the 1-step program operation being performed, memory cells connected to the word line WL1 may be programmed according LSB page data and CSB page data. The memory cells may be programmed to have an erased state and program states Q1 to Q3.

Referring to FIG. 8 and a reference numeral '22' illustrated in FIG. 9, a 1-step program operation on a word line WL2 may be performed. At this time, threshold voltage distributions of the memory cells connected to the word line WL1 may widen due to the influence of coupling.

Referring to FIG. 8 and a reference numeral '23' illustrated in FIG. 9, a coarse program operation on the word line WL3 may be performed. In response to the coarse program operation being performed, memory cells connected to the word line WL1 may be programmed according to LSB page data, CSB page data, and MSB page data. The memory cells may be programmed to have an erased state and program states P1' to P7'.

Referring to FIG. 8 and a reference numeral '24' illustrated in FIG. 9, a coarse program operation on the word line WL2 may be performed. In response to the coarse program operation on the word line WL2 being performed, threshold voltage distributions of memory cells connected to the word line WL2 may widen due to the influence of coupling.

Referring to FIG. 8 and a reference numeral '25' illustrated in FIG. 9, a fine program operation on the word line WL1 may be performed. In response to the fine program operation on the word line WL1 being performed, memory cells connected to the word line WL1 may be programmed according to LSB page data, CSB page data, and MSB page data. The memory cells may be programmed to have an erased state and program states P1 to P7.

Referring to FIG. 8 and a reference numeral '26' illustrated in FIG. 9, a fine program operation on the word line WL2 may be performed. In response to the fine program operation on the word line WL2 being performed, threshold voltage distributions of memory cells connected to the word line WL1 may widen due to the influence of coupling.

As illustrated in FIGS. 8 and 9, triple level cells may be, for example, sequentially 1-step programmed, coarse programmed, and fine programmed. This programming method may enable accuracy to be gradually improved in consideration of coupling from an adjacent word line.

In embodiments of the present inventive concept, a word line in the second type area 113 may have, for example, a physical program address and three physical read addresses. In a program operation, a physical program address and a program command that indicates a 1-step program operation, a coarse program operation, or a fine program operation may be provided to the nonvolatile memory 110. The three physical read addresses may correspond to, respectively, an LSB page, a CSB page, and an MSB page.

In other embodiments of the present inventive concept, a word line in the second type area 113 may have, for example, three physical program addresses and three physical read addresses. The three physical program addresses may correspond to, respectively, 1-step program, coarse program and fine program operations. In a program operation, one of the three physical program addresses and a program command may be provided to the nonvolatile memory 110. The three physical read addresses may correspond to, respectively, an LSB page, a CSB page, and an MSB page.

A program method described with reference to FIGS. 8 and 9 may be a reprogram method. However, the present inventive concept is not limited thereto. The scope and spirit of the inventive concept may be applied to a shadow program method. A program sequence of the shadow program method may be the same as that illustrated in FIG. 8. In response to a first program operation being performed on a predetermined word line, LSB page data may be programmed. In response to a second program operation being performed on the predetermined word line, CSB page data may be programmed. In response to a third program operation being performed on the predetermined word line, MSB page data may be programmed.

Figures 10, 11:
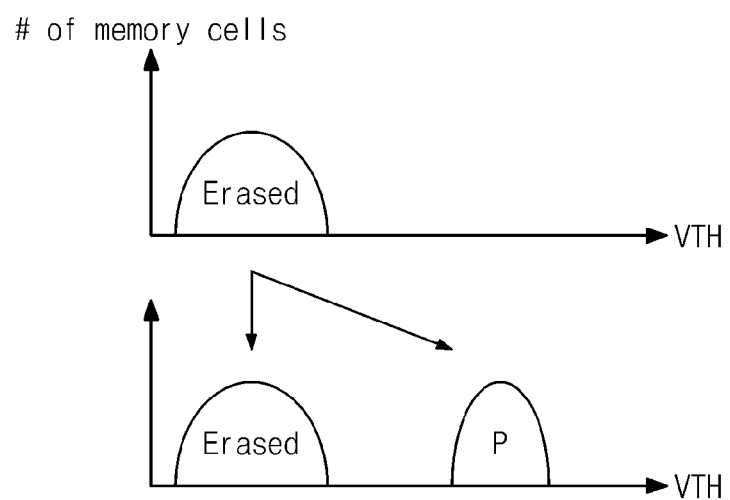
FIG. 10 includes a table that illustrates a program sequence of a first type area of a nonvolatile memory, according to an embodiment of the present inventive concept.
FIG. 11 includes graphs that illustrate variations in threshold voltages of memory cells associated with performance of a program method illustrated in FIG. 10, according to an embodiment of the present inventive concept.

FIG. 10 includes a table that illustrates a program sequence of the first type area 111 of the nonvolatile memory 110, according to an embodiment of the present inventive concept. For the explanation that follows, and not by way of limitation, it is assumed that the first type area 111 includes single level cells (SLCs). However, the inventive concept is not limited thereto.

In embodiments of the present inventive concept, the first type area 111 includes a plurality of memory blocks. A program sequence illustrated in FIG. 10 may correspond to one of the memory blocks.

Referring to FIGS. 1 and 10, a program operation on a word line WL1 may be performed, a program operation on a word line WL2 may be performed, and a program operation on a word line WL3 may be performed. A program operation on each word line may be performed once. In response to a program operation of a predetermined word line being performed, a program operation on a next word line may be performed.

FIG. 11 includes graphs that illustrate variations in threshold voltages of memory cells associated with performance of a program method illustrated in FIG. 10, according to an embodiment of the present inventive concept. In FIG. 11, a horizontal axis indicates threshold voltages (VTH) of memory cells, and a vertical axis indicates the number of memory cells. That is, FIG. 11 illustrates threshold voltage distributions of memory cells.

Referring to FIGS. 10 and 11, in response to a program operation on a predetermined word line being performed, each memory cell that has an erased state may be programmed to have the erased state or a program state P.

Figure 12:
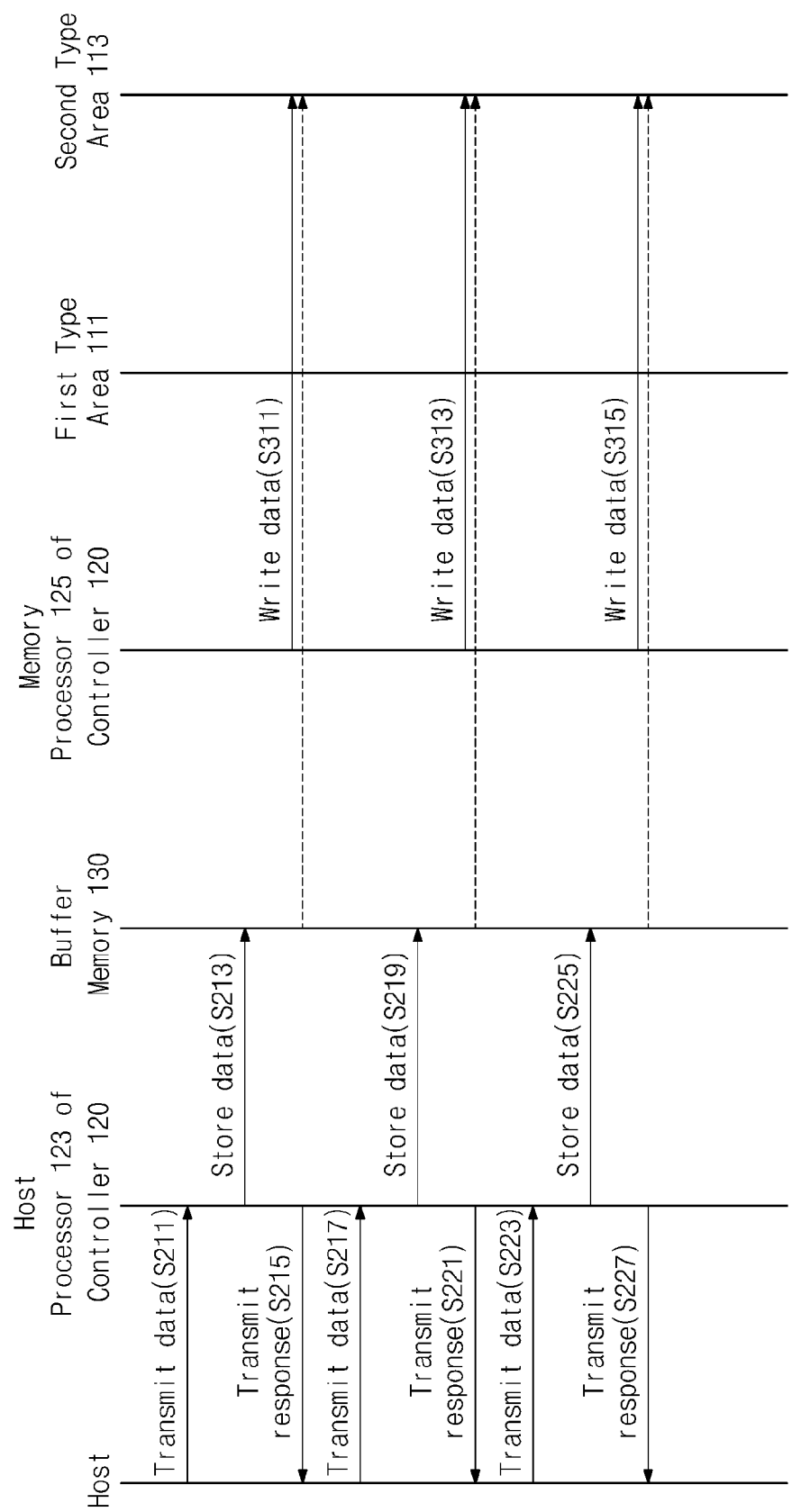
FIG. 12 includes a diagram that illustrates a method of programming a memory system illustrated in FIG. 1, according to an embodiment of the present inventive concept.
Figure 13:
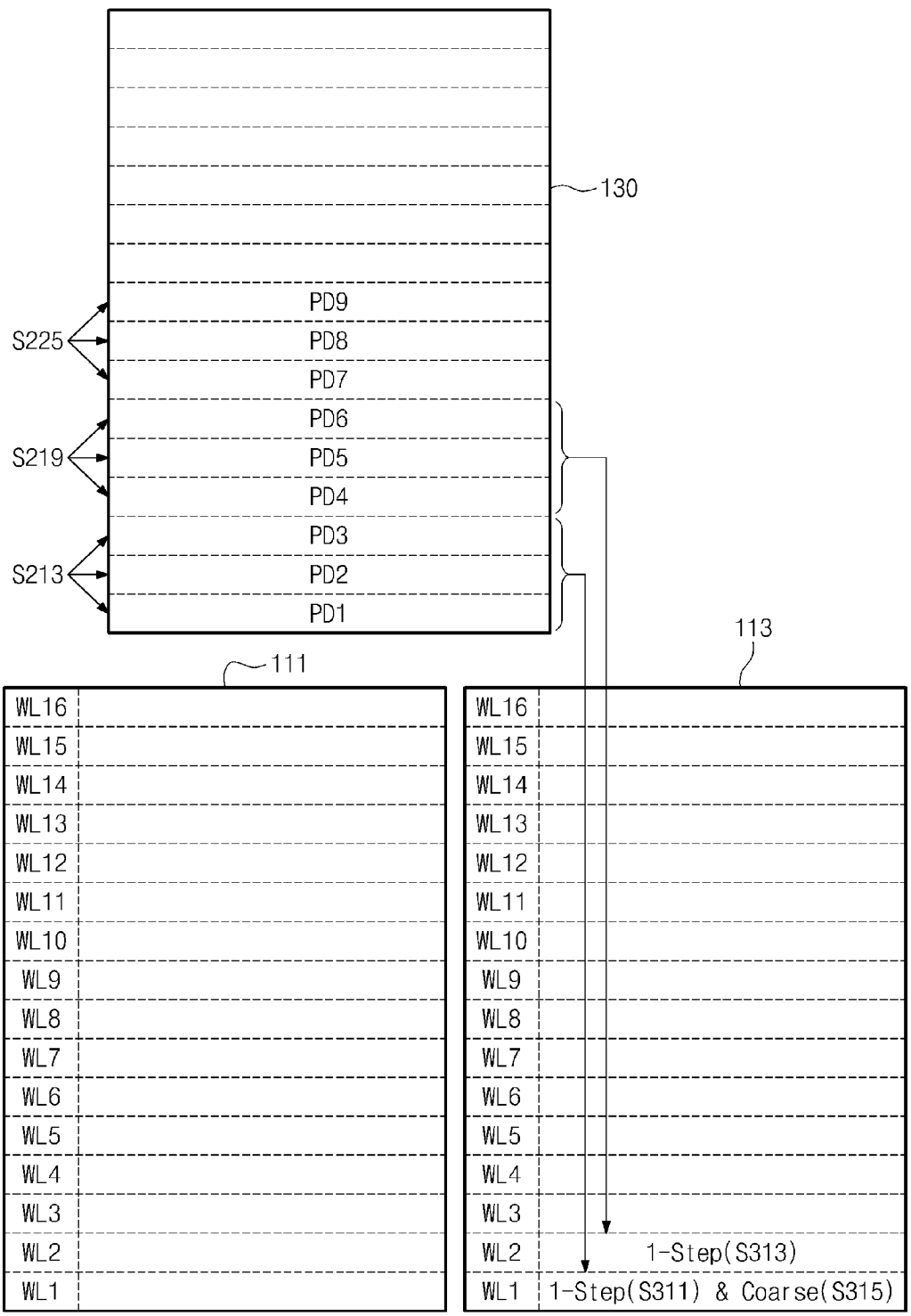
FIG. 13 includes tables that illustrate an example of an embodiment in which a method of programming illustrated in FIG. 12 is applied to a first type area, a second type area, and a buffer memory.

FIG. 12 includes a diagram that illustrates a method of programming the memory system 100 illustrated in FIG. 1, according to an embodiment of the present inventive concept. In FIG. 13, there is illustrated an embodiment in which the method of programming illustrated in FIG. 12 is applied to the first type area 111, the second type area 113, and the buffer memory 130.

Referring to FIGS. 1, 2, 12, and 13, in an operation S211, the host processor 123 may receive data PD1, PD2, and PD3 from an external device (e.g., a host) (not illustrated). In an operation S213, the host processor 123 may store the input data PD1, PD2, and PD3 in the buffer memory 130. In an operation S215, the host processor 123 may transmit a response to the external device. The response may be a message that informs the external device that writing of the data PD1, PD2, and PD3 is completed. In response to the data PD1, PD2, and PD3 being stored in the buffer memory 130, the memory system 100 may inform the external device that writing of the data PD1, PD2, and PD3 is completed. That is, the data PD1, PD2, and PD3 may not be programmed in the nonvolatile memory 110.

In embodiments of the present inventive concept, in the operations S211 to S215, all the data PD1, PD2, and PD3 to be programmed in memory cells of a word line of the second type area 113 may be stored in the buffer memory 130. For example, the LSB page data PD1, the CSB page data PD2, and the MSB page data PD3 may be stored in the buffer memory 130. For ease of description, it is assumed that the LSB page data PD1, the CSB page data PD2, and the MSB page data PD3 are stored in the buffer memory 130 through one data transfer operation. However, the LSB page data PD1, the CSB page data PD2, and the MSB page data PD3 may be stored in the buffer memory 130 through a plurality of data transfer operations. For example, the operations S211 to S215 may include a plurality of data transfer operations, a plurality of data storing operations, and/or a plurality of response transmitting operations.

In operations S217, S219, and S221, the host processor 123 may receive the data PD4, PD5, and PD6 from the external device. The host processor 123 may store the input data PD4, PD5, and PD6 in the buffer memory 130. For example, the LSB page data PD4, the CSB page data PD5, and the MSB page data PD6 may be stored in the buffer memory 130.

In operations S223, S225, and S227, the host processor 123 may store the input data PD7, PD8, and PD9 received from the external device in the buffer memory 130. For example, the LSB page data PD7, the CSB page data PD8, and the MSB page data PD9 may be stored in the buffer memory 130.

As the data PD1, PD2, and PD3 is stored in the buffer memory 130 in the operation S213, in an operation S311, the memory processor 125 may program the data PD1, PD2, and PD3 to the second type area 113 of the nonvolatile memory 110. A 1-step program operation on the word line WL1 in the second type area 113 may be performed based on the data PD1, PD2, and PD3.

In embodiments of the present inventive concept, a program time of the second type area 113 may be longer than a storage time of the buffer memory 130. Programming of the second type area 113 may end after the operation S219.

If programming of the operation S311 ends, the data PD4, PD5, and PD6 may be stored in the buffer memory 130. Thus, in an operation S313, the memory processor 125 may program the data PD4, PD5, and PD6 to the second type area 113 of the nonvolatile memory 110. A 1-step program operation on the word line WL2 in the second type area 113 may be performed based on the data PD4, PD5, and PD6.

If programming of the operation S311 ends, the data PD1, PD2, and PD3 may be stored in the second type area 113. In an operation S315, a coarse program operation on the word line WL1 in the second type area 113 may be performed based on the data PD1, PD2, and PD3.

Figure 14:
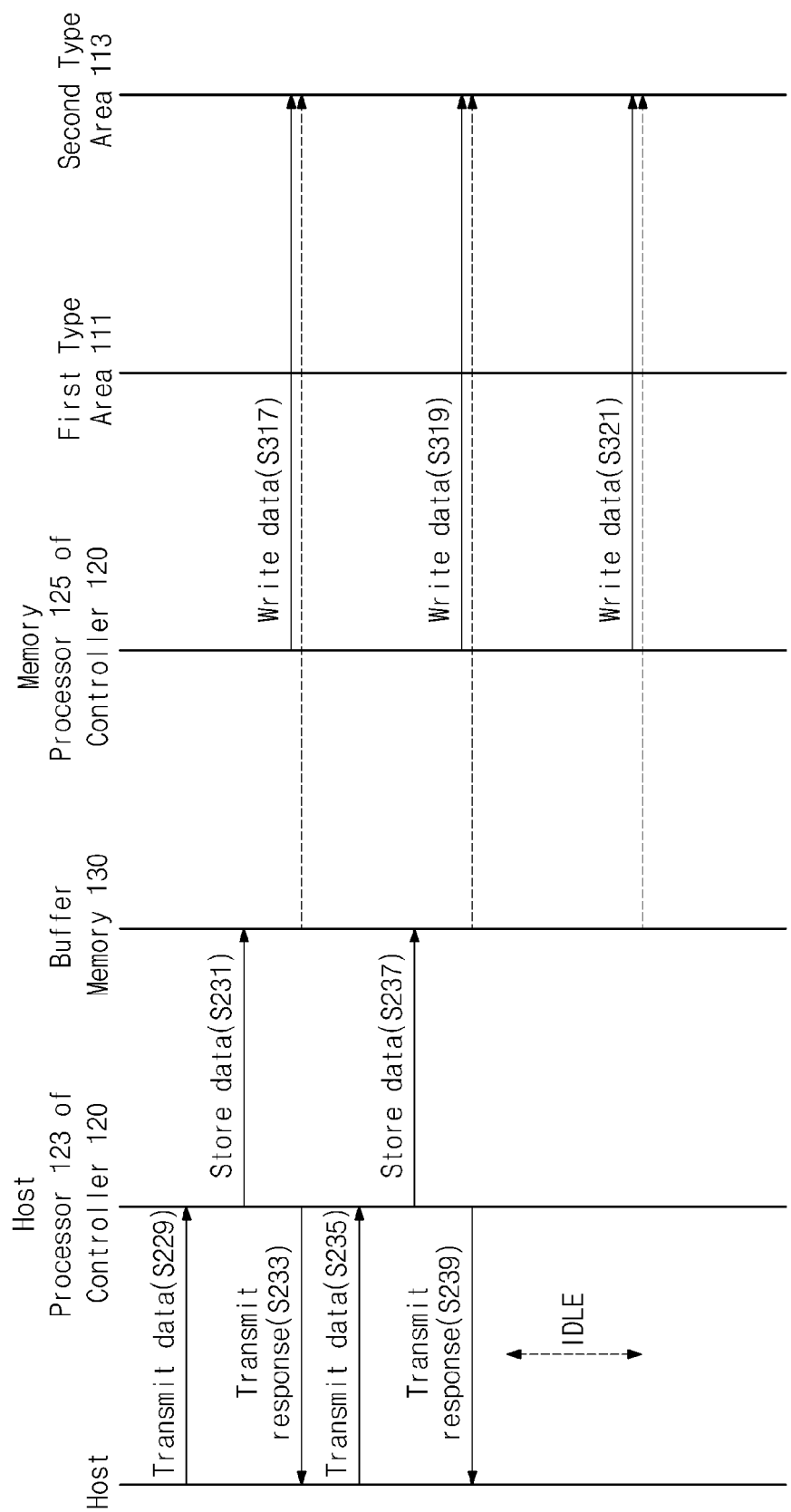
FIG. 14 includes a diagram that illustrates a method of programming a memory system illustrated in FIG. 1, according to another embodiment of the present inventive concept.
Figure 15:
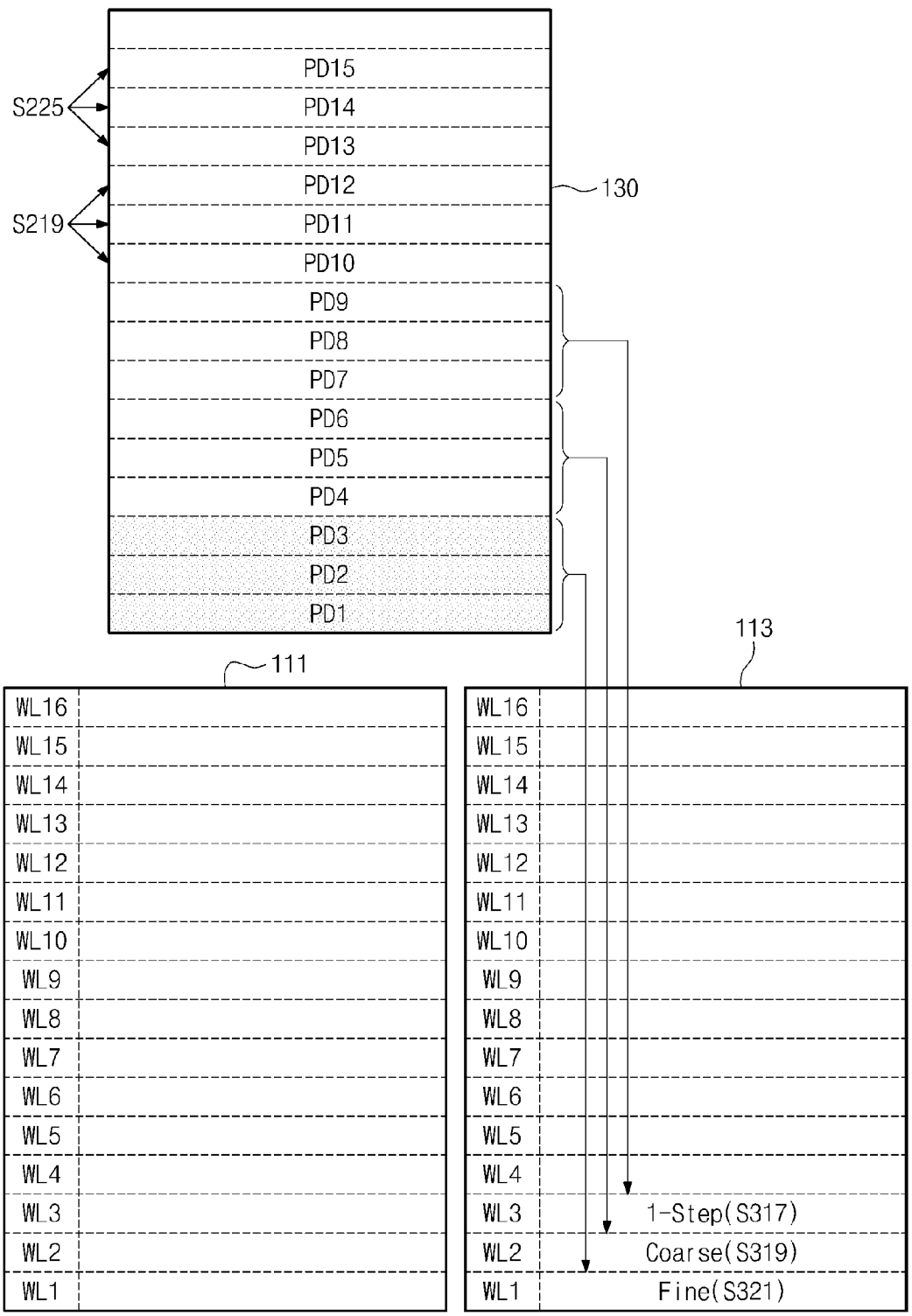
FIG. 15 includes tables that illustrate an example of an embodiment in which a method of programming illustrated in FIG. 14 is applied to a first type area, a second type area, and a buffer memory.

FIG. 14 is a diagram that illustrates a method of programming the memory system 100 illustrated in FIG. 1, according to another embodiment of the present inventive concept. In FIG. 15, there is illustrated an embodiment in which the method of programming illustrated in FIG. 14 is applied to the first type area 111, the second type area 113, and the buffer memory 130. In embodiments of the present inventive concept, procedures that follow those illustrated in FIGS. 12 and 13 are illustrated in FIGS. 14 and 15.

In operations S229, S231, and S233, the host processor 123 may store data PD10, PD11, and PD12 received from an external device in the buffer memory 130. For example, the LSB page data PD10, the CSB page data PD11, and the MSB page data PD12 may be stored in the buffer memory 130.

In operations S235, S237, and S239, the host processor 123 may store data PD13, PD14, and PD15 received from the external device in the buffer memory 130. For example, the LSB page data PD13, the CSB page data PD14, and the MSB page data PD15 may be stored in the buffer memory 130.

Afterwards, for example, data transfer between the external device and the memory system 100 may enter an idle state. For example, the external device may not request a write operation to the memory system 100.

If programming of the operation S315 ends, in an operation S317, the memory processor 125 may program the data PD7, PD8, and PD9 to the second type area 113 of the nonvolatile memory 110. A 1-step program operation on the word line WL3 in the second type area 113 may be performed based on the data PD7, PD8, and PD9.

If programming of the operation S317 ends, in an operation S319, the memory processor 125 may program the data PD4, PD5, and PD6 to the second type area 113 of the nonvolatile memory 110. A coarse program operation on a word line WL2 in the second type area 113 may be performed based on the data PD4, PD5, and PD6.

If programming of the operation S317 ends, in an operation S321, the memory processor 125 may program the data PD1, PD2, and PD3 to the second type area 113 of the nonvolatile memory 110. A fine program operation on the word line WL1 in the second type area 113 may be performed based on the data PD1, PD2, and PD3.

If the fine program operation is performed, programming on the data PD1, PD2, and PD3 may be completed. If programming ends, the data PD1, PD2, and PD3 stored in the buffer memory 130 may be released. Also, the mapping table 121 may be updated.

FIG. 16 illustrates the mapping table 121 updated at a program operation described with reference to FIGS. 14 and 15, according to an embodiment of the present inventive concept. Referring to FIGS. 14 to 16, the logical address LA_1_3 that corresponds to the data PD1, PD2, and PD3 may be recorded in the logical address field. The logical address LA_1_3 may be an address range that corresponds to the data PD1, PD2, and PD3. The physical address PA_113_1 of the word line WL1 in the second type area 113 where the data PD1, PD2, and PD3 is programmed may be recorded in the physical address field.

Figure 17:
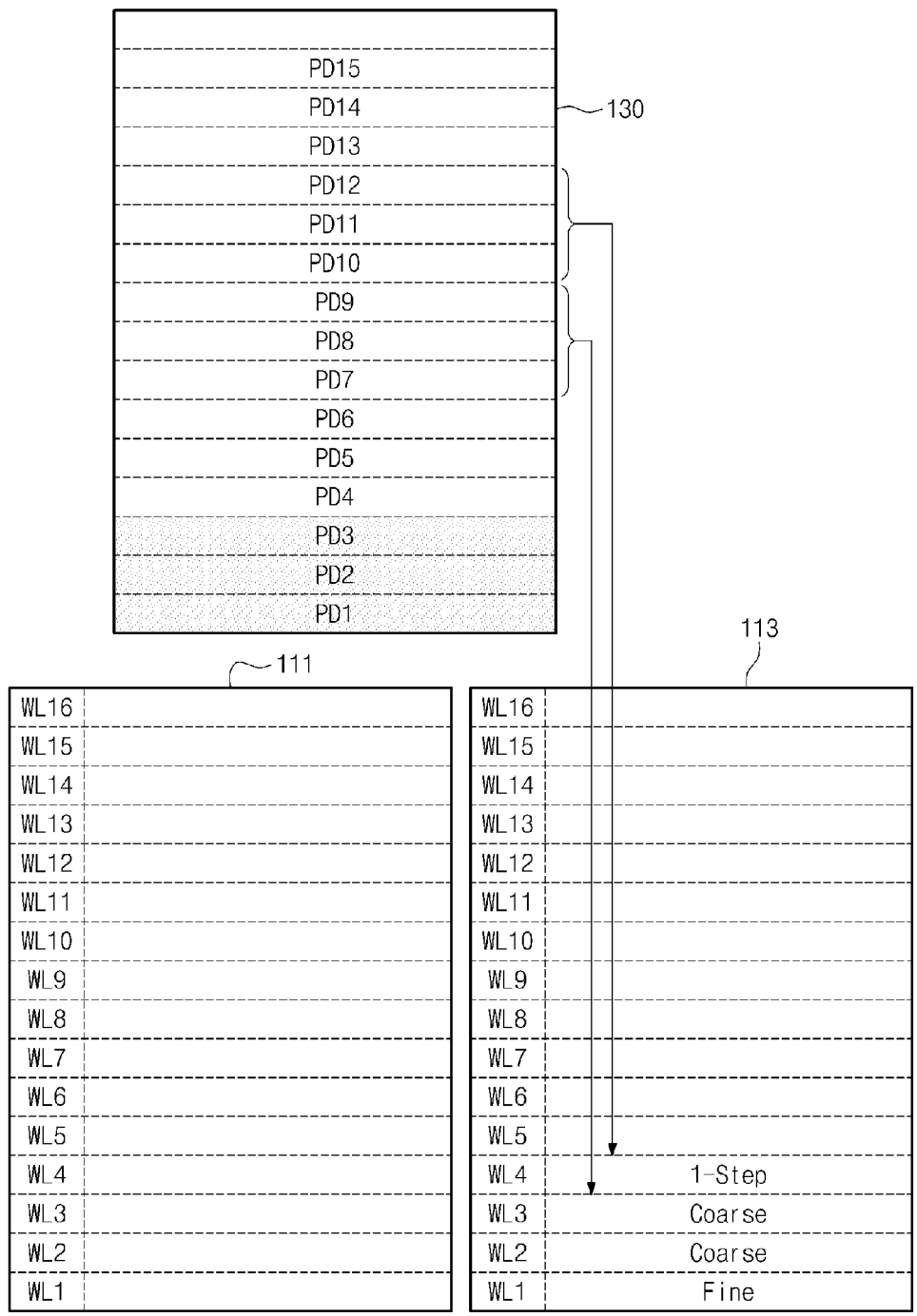
FIG. 17 includes tables that illustrate an example of an embodiment in which a method of programming illustrated in FIGS. 14 and 15 is applied to a first type area, a second type area, and a buffer memory.

After completion of the procedures illustrated in FIGS. 14 and 15, the memory processor 125 may continue to program data stored in the buffer memory 130. FIG. 17 includes tables that illustrate an example of an embodiment in which a method of programming as illustrated in FIGS. 14 and 15 is applied to the first type area 111, the second type area 113, and the buffer memory 130. Referring to FIGS. 14 to 17, the memory processor 125 may program the data PD10, PD11, and PD12 to the second type area 113. A 1-step program operation on the word line WL4 in the second type area 113 may be performed based on the data PD10, PD11, and PD12.

Afterwards, the memory processor 125 may program the data PD7, PD8, and PD9 to the second type area 113. A coarse program operation on the word line WL3 in the second type area 113 may be performed based on the data PD7, PD8, and PD9.

Figure 18:
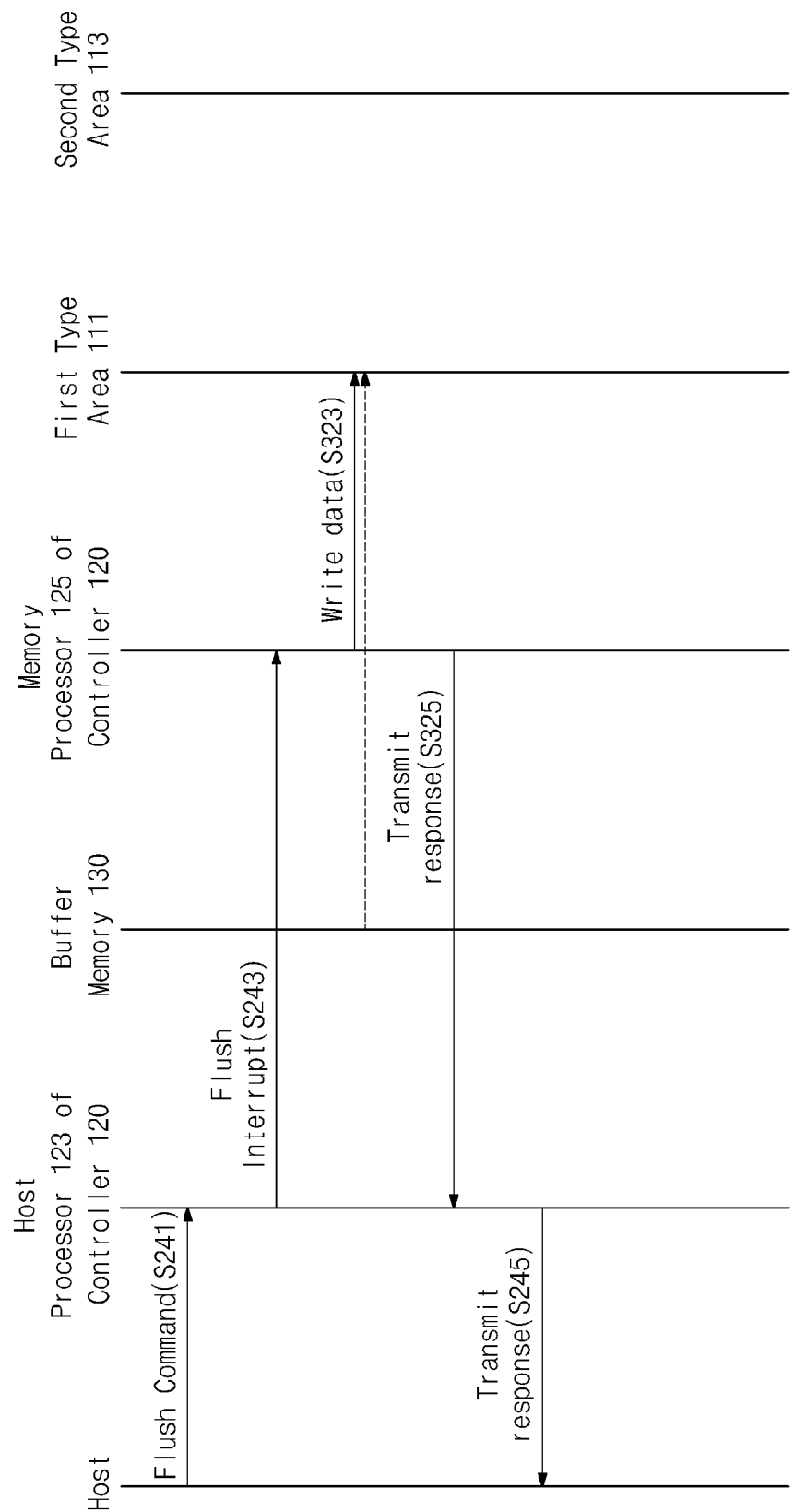
FIG. 18 includes a diagram that illustrates a method of programming a memory system illustrated in FIG. 1, according to still another embodiment of the present inventive concept.
Figure 19:
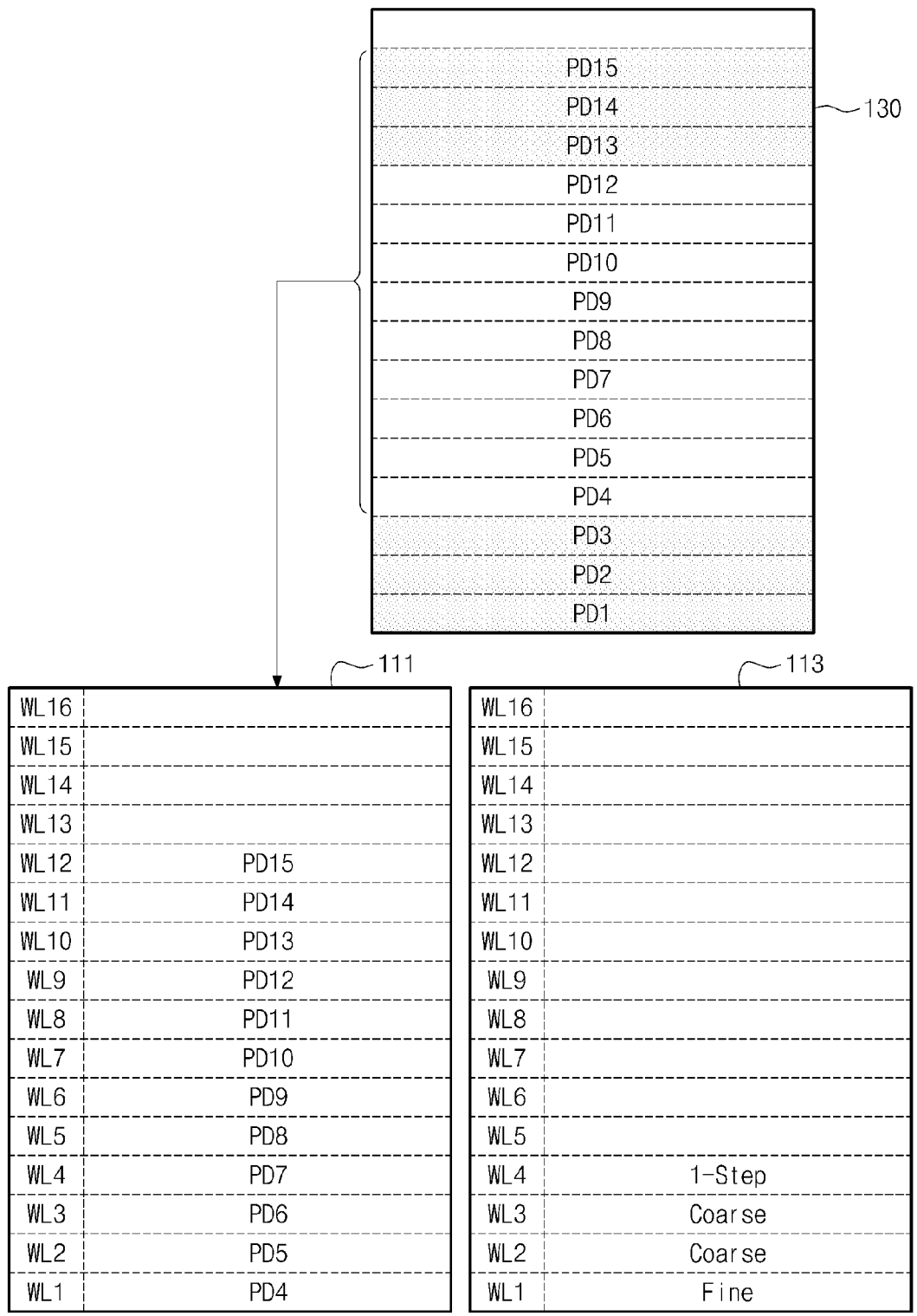
FIG. 19 includes tables that illustrate an example of an embodiment in which a method of programming illustrated in FIG. 18 is applied to a first type area 111, a second type area 113, and a buffer memory 130.

FIG. 18 includes a diagram that illustrates a method of programming the memory system 100 illustrated in FIG. 1, according to still another embodiment of the present inventive concept. In FIG. 19, there is illustrated an embodiment in which the method of programming illustrated in FIG. 18 is applied to the first type area 111, the second type area 113 and the buffer memory 130. In embodiments of the present inventive concept, procedures that follow those illustrated in FIG. 17 are illustrated in FIGS. 18 and 19.

Referring to FIGS. 1, 2, 18, and 19, in an operation S241, the host processor 123 may receive a flush command from an external device. In an operation S243, the host processor 123 may transmit a flush interrupt signal to the memory processor 125 in response to the flush command. If a response that indicates that a flush operation ends is received from the memory processor 125 (an operation S325), in an operation S245, the host processor 124 may provide the external device with a response that informs that a flush operation is completed.

In a normal mode, the host processor 123 may transmit a response to the external device when data is stored in the buffer memory 130. On the other hand, if a flush command that requires a guarantee mode is received, the memory system 100 may change to the guarantee mode. After data stored in the buffer memory 130 is programmed in the nonvolatile memory 110, the host processor 123 may transmit a response that informs that a flush operation is completed.

In response to the flush interrupt signal transmitted from the host processor 123, in an operation S323, the memory processor 125 may program the data PD4 to PD15 stored in the buffer memory 130 to the first type area 111. A program time of the first type area 111 may be shorter than that of the second type area 113. Thus, in the guarantee mode, if the data PD4 to PD15 stored in the buffer memory 130 is programmed to the first type area 111, a response time of the memory system 100 may be shortened. For example, it may be possible to shorten a time consumed by the memory system 100 to transmit a response to the flush command.

If an operation of programming the data PD4 to PD15 stored in the buffer memory 130 to the first type area 111 ends, the remaining data PD13 to PD15 of the data PD4 to PD15 stored in the buffer memory 130, other than the data PD4 to PD12 being programmed in the second type area 113, may be released. In embodiments of the present inventive concept, the data PD4 to PD6 may be programmed in memory cells of the word line WL2 of the second type area 113, the data PD7 to PD9 may be programmed in memory cells of the word line WL3 of the second type area 113, and the data PD10 to PD12 may be programmed in memory cells of the word line WL4 of the second type area 113. Thus, the data PD4 to PD12 may be maintained in the buffer memory 130, and the data PD13 to PD15 may be released from the buffer memory 130.

FIG. 20 illustrates the mapping table 121 updated at a program operation described with reference to FIGS. 18 and 19, according to an embodiment of the present inventive concept. Referring to FIGS. 18 to 20, the logical address LA_4_6 that corresponds to data PD4, PD5, and PD6 may be recorded in the logical address field. The logical address LA_4_6 may be an address range corresponding to the data PD4, PD5, and PD6. The physical address PA_111_1_3 of the word lines WL1 to WL3 in the first type area 111 where the data PD4, PD5, and PD6 is programmed may be recorded in the physical address field.

The logical address LA_7_9 that corresponds to data PD7, PD8, and PD9 may be recorded in the logical address field. The logical address LA_7_9 may be an address range that corresponds to the data PD7, PD8, and PD9. The physical address PA_111_4_6 of the word lines WL4 to WL6 in the first type area 111 where the data PD7, PD8, and PD9 is programmed may be recorded in the physical address field.

The logical address LA_10_12 that corresponds to the data PD10, PD11, and PD12 may be recorded in the logical address field. The physical address PA_111_7_9 of the word lines WL7 to WL9 in the first type area 111 where the data PD10, PD11, and PD12 is programmed may be recorded in the physical address field.

The logical address LA_13_15 that corresponds to the data PD13, PD14, and PD15 may be recorded in the logical address field. The physical address PA_111_10_12 of the word lines WL10 to WL12 in the first type area 111 where the data PD13, PD14, and PD15 is programmed may be recorded in the physical address field.

Figure 21:
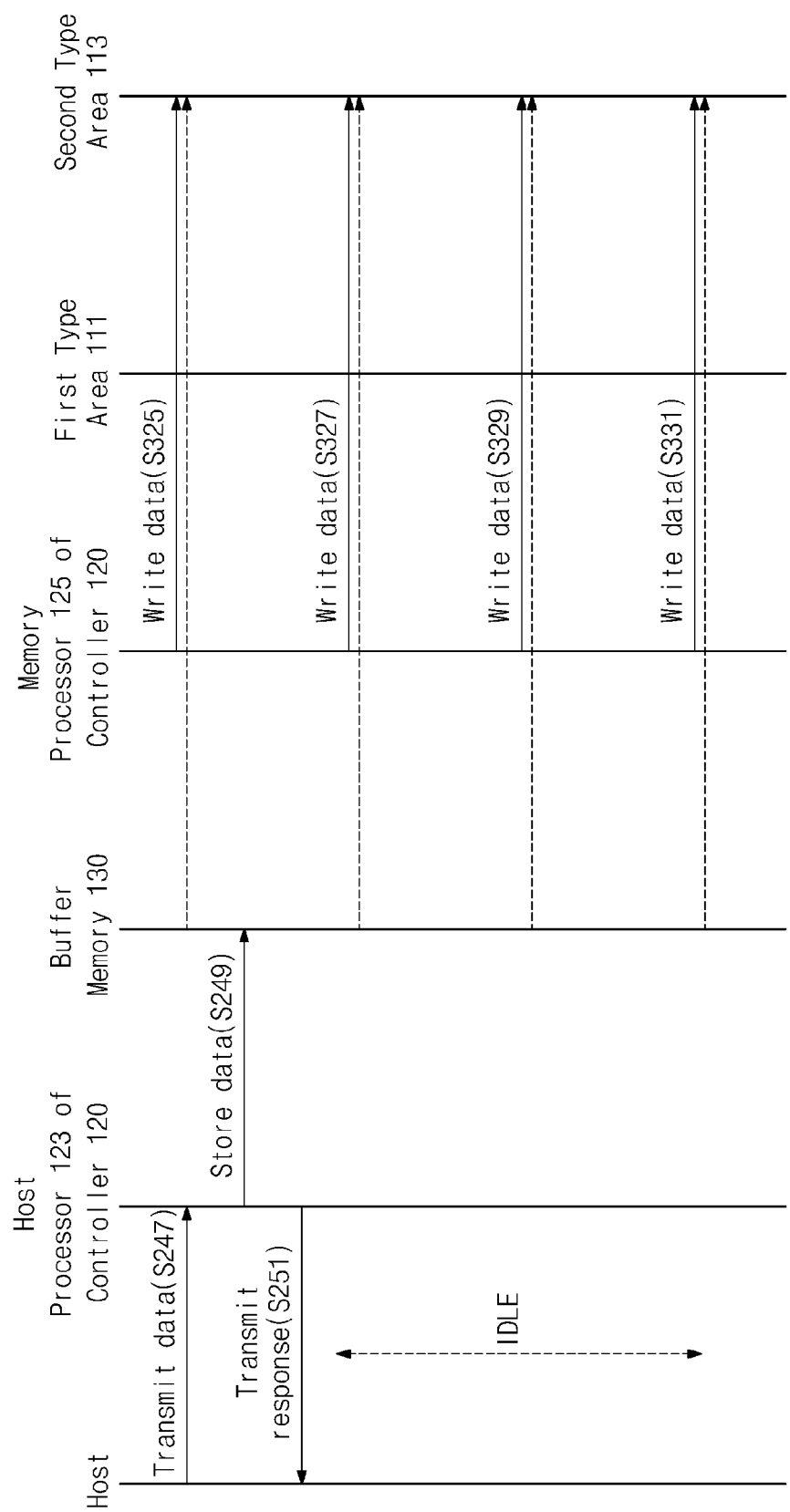
FIG. 21 includes a diagram that illustrates a method of programming of a memory system illustrated in FIG. 1, according to a further embodiment of the present inventive concept.
Figure 22:
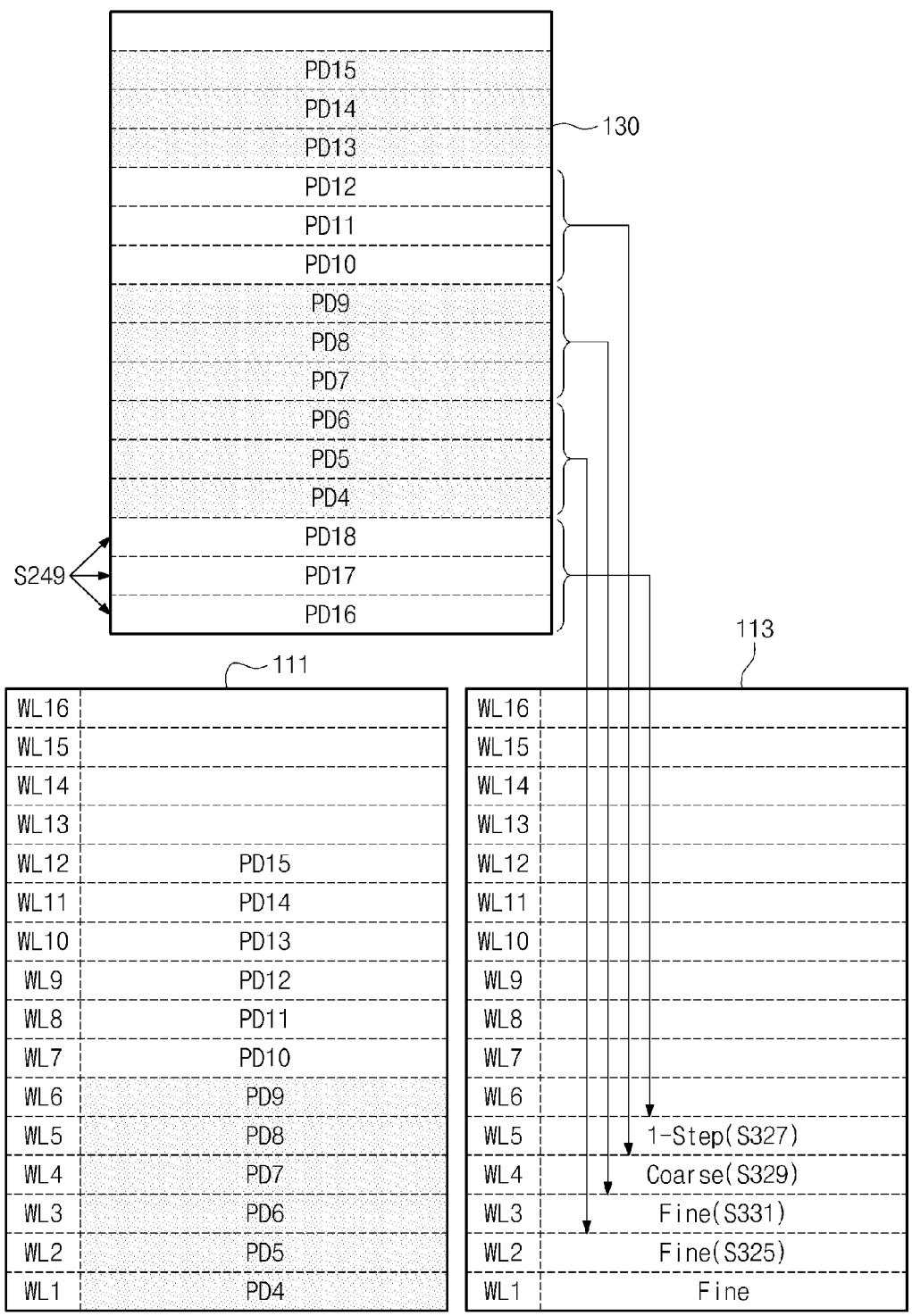
FIG. 22 includes tables that illustrate an example of an embodiment in which a method of programming illustrated in FIG. 21 is applied to a first type area, a second type area, and a buffer memory.

FIG. 21 includes a diagram that illustrates a method of programming a memory system illustrated in FIG. 1, according to a further embodiment of the present inventive concept. In FIG. 22, there is illustrated an embodiment in which the method of programming illustrated in FIG. 21 is applied to the first type area 111, the second type area 113 and the buffer memory 130. FIG. 23 illustrates the mapping table 121 updated during a program operation illustrated in FIGS. 21 and 22, according to an embodiment of the present inventive concept. In embodiments of the present inventive concept, procedures that follow those illustrated in FIGS. 18 and 19 are illustrated in FIGS. 21 to 23.

In operations S247, S249, and S251, the host processor 123 may store the data PD16, PD17, and PD18 received from an external device in the buffer memory 130. For example, the host processor 123 may store the LSB page data PD10, the CSB page data PD11, and the MSB page data PD12 in the buffer memory 130.

Afterwards, for example, data transfer between the external device and the memory system 100 may enter an idle state.

As a flush operation ends, the memory processor 125 may resume an operation of programming data stored in the buffer memory 130 to the second storage area 113. In an operation S325, the memory processor 125 may program the data PD4, PD5, and PD6 to the second type area 113. A fine program operation on the word line WL2 in the second type area 113 may be performed based on the data PD4, PD5, and PD6.

If the fine program operation is performed, programming on the word line WL2 in the second type area 113 may end. Thus, the data PD4, PD5, and PD6 may be released from the buffer memory 130.

The physical address PA_111_1_3, that indicates the word lines WL1 to WL3 of the first type area 111, in the physical address field of the mapping table 121 may be updated with the physical address PA_113_2 that indicates the word line WL2 of the second type area 113. As the mapping table 121 is updated, the data PD4 to PD6 stored in memory cells of the word lines WL1 to WL3 of the first type area 111 may be invalidated.

As programming of an operation S325 ends, in an operation S327, the memory processor 125 may program the data PD16, PD17, and PD18 to the second type area 113. A 1-step program operation on the word line WL5 in the second type area 113 may be performed based on the data PD16, PD17, and PD18.

As programming of the operation S327 ends, in an operation S329, the memory processor 125 may program the data PD10, PD11, and PD12 in the second type area 113. A coarse program operation on the word line WL4 in the second type area 113 may be performed based on the data PD10, PD11, and PD12.

As programming of the operation S329 ends, in an operation S331, the memory processor 125 may program the data PD7, PD8, and PD9 in the second type area 113. A fine program operation on the word line WL3 in the second type area 113 may be performed based on the data PD7, PD8, and PD9.

If the fine program operation is performed, programming on the word line WL3 in the second type area 113 may end. Thus, the data PD7, PD8, and PD9 may be released from the buffer memory 130.

The physical address PA_111_4_6, that indicates the word lines WL4 to WL6 of the first type area 111, in the physical address field of the mapping table 121 may be updated with the physical address PA_113_3 that indicates the word line WL3 of the second type area 113. As the mapping table 121 is updated, the data PD7 to PD9 stored in memory cells of the word lines WL4 to WL6 of the first type area 111 may be invalidated.

Figure 24:
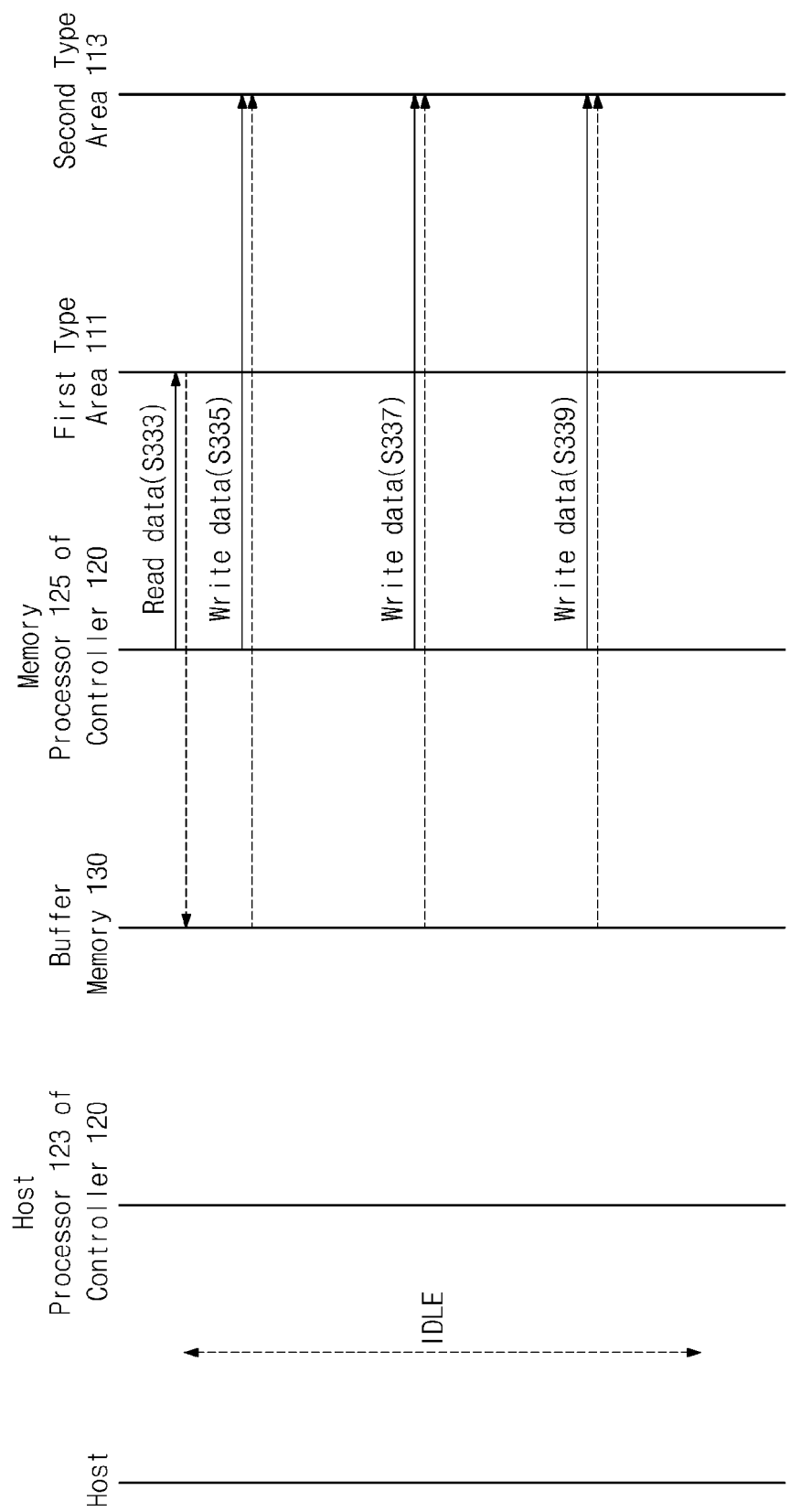
FIG. 24 includes a diagram that illustrates a method of programming a memory system illustrated in FIG. 1, according to another embodiment of the present inventive concept.
Figure 25:
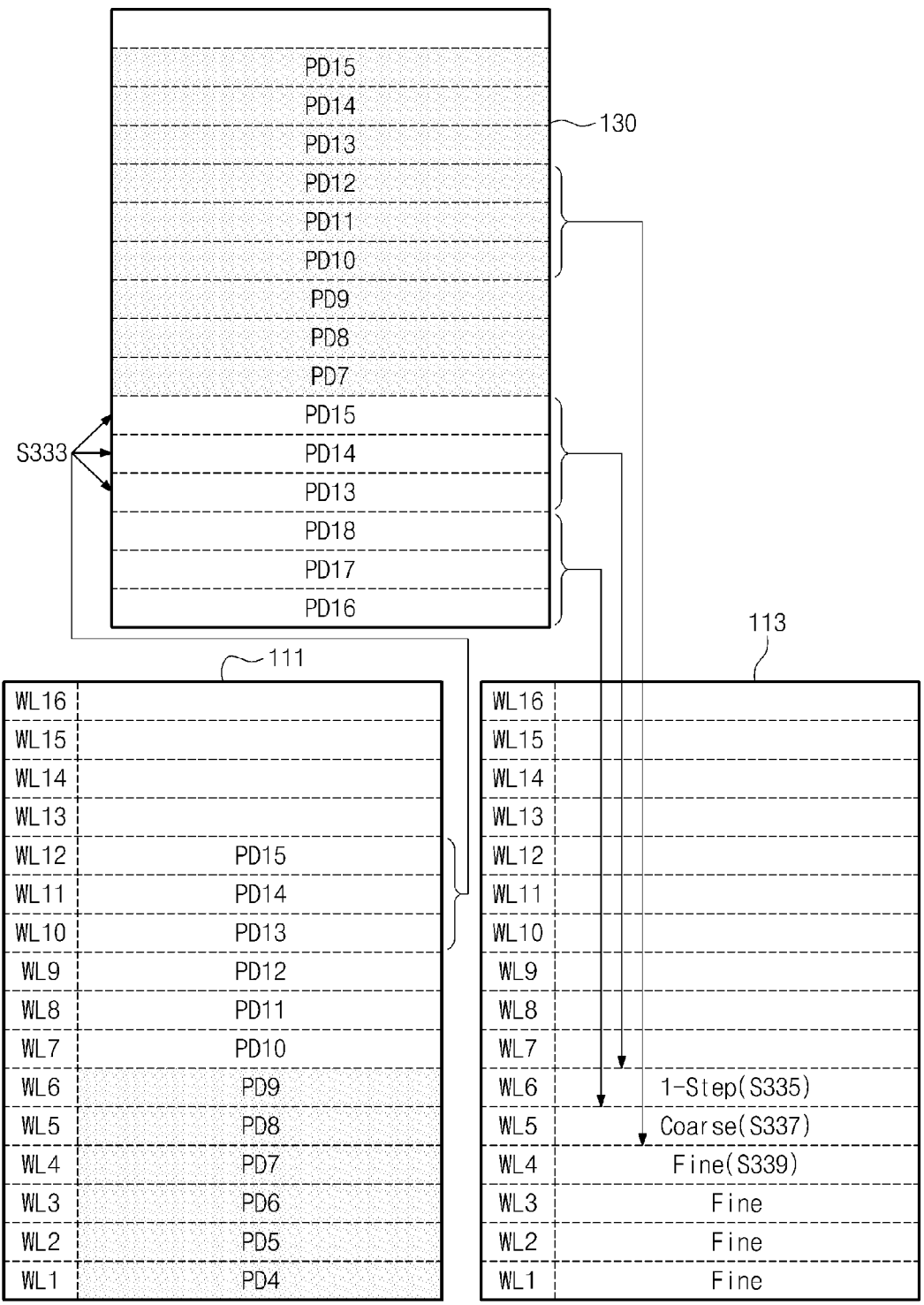
FIG. 25 includes tables that illustrate an example of an embodiment in which a method of programming illustrated in FIG. 24 is applied to a first type area, a second type area, and a buffer memory.

FIG. 24 includes a diagram that illustrates a method of programming the memory system 100 illustrated in FIG. 1, according to another embodiment of the present inventive concept. FIG. 25 includes tables that illustrate an example of an embodiment in which a method of programming illustrated in FIG. 24 is applied to the first type area 111, the second type area 113 and the buffer memory 130. FIG. 26 illustrates the mapping table 121 updated during a program operation described with reference to FIGS. 24 and 25, according to an embodiment of the present inventive concept. In embodiments of the present inventive concept, procedures that follow those illustrated in FIGS. 21 and 23 are illustrated in FIGS. 24 to 26.

Referring to FIGS. 1, 2, 24, 25, and 26, for example, data transfer between an external device and the memory system 100 may enter an idle state.

The memory processor 125 may continue to program data stored in the buffer memory 130 to the second type area 113. As described with reference to FIG. 8, data to be programmed in memory cells of the word line WL6 may be required for programming of the second type area 113. When corresponding data does not exist in the buffer memory 130, that is, at an idle time, the memory processor 125 may program data stored in the first type area 111 to the second type area 113.

In an operation S333, the memory processor 125 may read the data PD13, PD14, and PD15 programmed in the first type area 111. The read data PD13, PD14, and PD15 may be stored the buffer memory 130.

In an operation S335, the memory processor 125 may program the data PD13, PD14, and PD15 to the second type area 113. A 1-step program operation on the word line WL6 of the second type area 113 may be performed based on the data PD13, PD14, and PD15.

As programming of the operation S335 ends, in an operation S337, the memory processor 125 may program the data PD16, PD17, and PD18 to the second type area 113. A coarse program operation on the word line WL5 in the second type area 113 may be performed based on the data PD16, PD17, and PD18.

As programming of the operation S337 ends, in an operation S339, the memory processor 125 may program the data PD10, PD11, and PD12 in the second type area 113. A fine program operation on the word line WL5 in the second type area 113 may be performed based on the data PD10, PD11, and PD12.

If the fine program operation is performed, programming on the word line WL4 in the second type area 113 may end. Thus, the data PD10, PD11, and PD12 may be released from the buffer memory 130.

The physical address PA_111_7_9, that indicates the word lines WL7 to WL9 of the first type area 111, in the physical address field of the mapping table 121 may be updated with the physical address PA_113_4 that indicates the word line WL4 of the second type area 113. As the mapping table 121 is updated, the data PD10 to PD12 stored in memory cells of the word lines WL7 to WL9 of the first type area 111 may be invalidated.

FIG. 27 includes a diagram that illustrates an example of a method of managing data stored in the buffer memory 130 after a flush operation. Referring to FIGS. 1 and 27, as a first option, after a flush operation is performed, the remaining data of the data stored in the buffer memory 130, other than data associated with reprogramming, may be released. The first option may correspond to an embodiment described with reference to FIGS. 18 to 20.

As a second operation, the remaining data of the data stored in the buffer memory 130, other than data associated with reprogramming and additional data, may be released. In embodiments of the present inventive concept, the additional data may include LSB page data, CSB page data, and MSB page data programmed in memory cells of a word line in the second type area 113. In an embodiment described with reference to FIGS. 18 to 20, if the second option is applied, a buffer memory 130 may maintain the data PD13, PD14, and PD15 that corresponds to a word line. If the buffer memory 130 maintains the additional data, as described with reference to the operation S333 illustrated in FIG. 24, the number of read operation performed to read data from the first type area 111 may be reduced.

As a third option, the data stored in the buffer memory 130 may not be released, and the data stored in the first type area 111 may be checked. For example, flag data may be added to data backed up to the first type area 111. When a storage space of the buffer memory 130 is insufficient, data not associated with reprogramming may be released from the buffer memory 130 based on the flag data.

Figure 28:
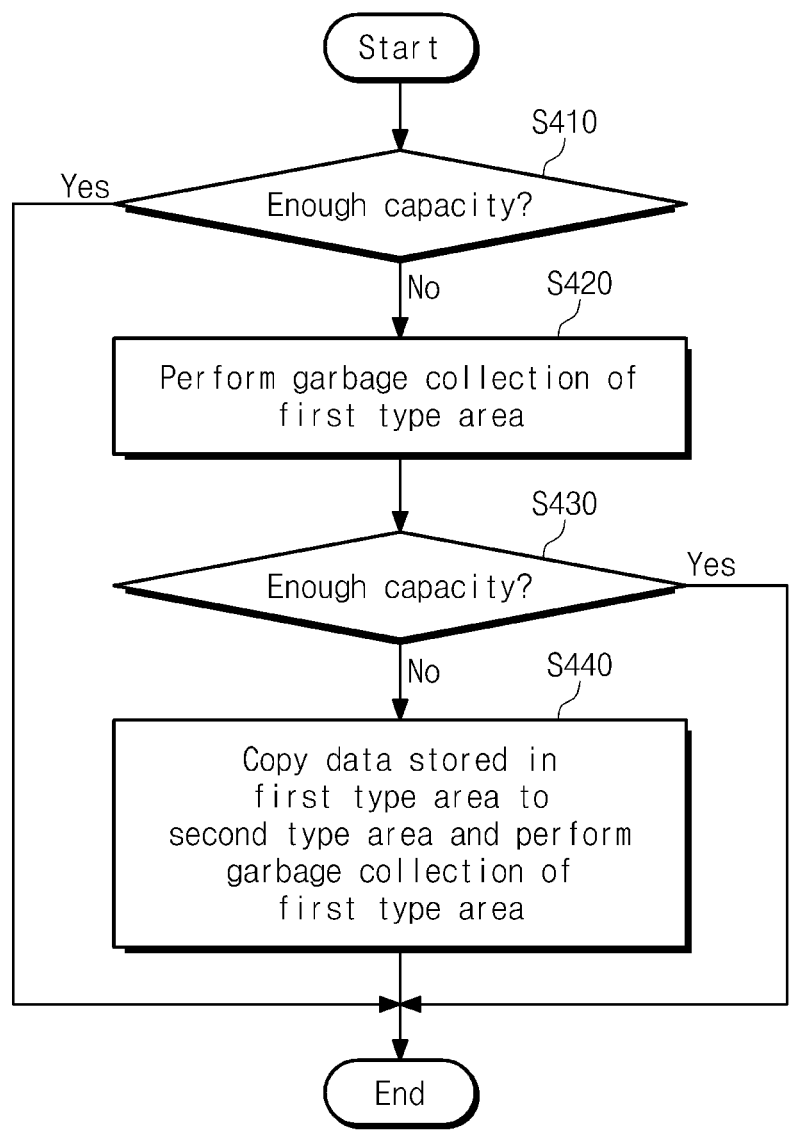
FIG. 28 is a flow chart illustrating a method in which a memory controller manages a first type area of a nonvolatile memory, according to an embodiment of the present inventive concept.

FIG. 28 is a flow chart illustrating a method in which the memory controller 120 manages the first type area 111 of the nonvolatile memory 110, according to an embodiment of the present inventive concept. In FIG. 28, there is illustrated a method in which the memory processor 123 manages the first type area 111 when a flush operation is performed.

Referring to FIGS. 1 and 28, in an operation S410, a determination as to whether a storage space of the first type area 111 is sufficient may be performed. For example, a determination as to whether the first type area 111 is fully programmed with data stored in the buffer memory 130 may be performed. When a storage space of the first type area 111 is sufficient, an additional operation may not be performed. When a storage space of the first type area 111 is insufficient, the method may proceed to an operation S420.

In the operation S420, a garbage collection operation on the first type area 111 may be performed.

In an operation S430, a determination as to whether a storage space of the first type area 111 is sufficient may be performed.

When a storage space of the first type area 111 is insufficient, in an operation S440, data stored in the first type area 111 may be copied to the second type area 113. Then, a garbage collection operation on the first type area 111 may be performed.

In embodiments of the present inventive concept, an operation illustrated in FIG. 28 may be performed before or during a flush operation.

In other embodiments of the present inventive concept, when a storage space of the first type area 111 is insufficient, the flush operation on the second type area 113 may be performed. For example, a part of the data stored in the buffer memory 130 may be programmed to the first type area 111. The remaining data read in the buffer memory 130 may be directly programmed to the second type area 113.

Figure 29:
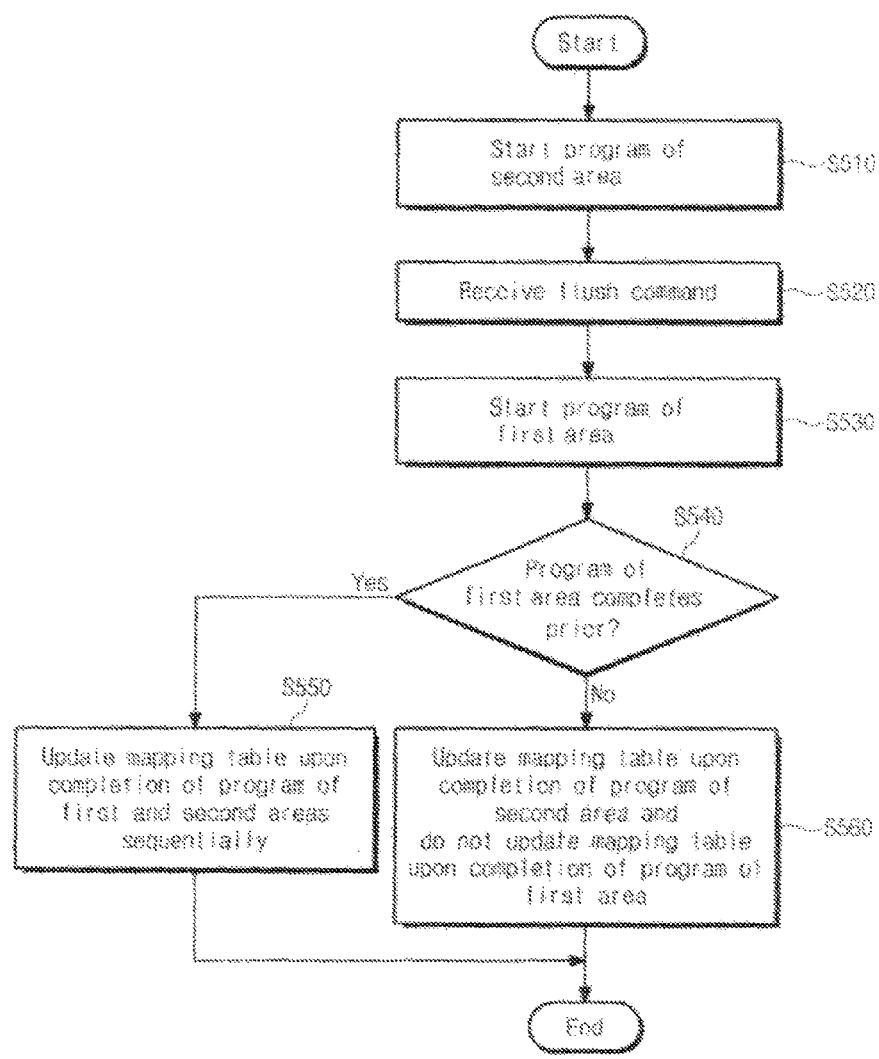
FIG. 29 is a flow chart illustrating a method of updating a mapping table of a memory controller, according to an embodiment of the present inventive concept.

FIG. 29 is a flow chart illustrating a method of updating the mapping table 121 of the memory controller 120, according to an embodiment of the present inventive concept. Referring to FIGS. 1 and 29, in an operation S510, a program operation of the second type area 113 starts.

Before the program operation of the second type area 113 ends, in an operation S520, a flush command is received.

In an operation S530, a program operation of the first type area 111 starts.

In an operation S540, a determination as to whether the program operation of the first type area 111 ends prior to the program operation of the second type area 113 may be performed. If so, in an operation S550, the program operations of the first and second type areas 111 and 113 may sequentially end. For example, after the program operation of the first type area 111 ends, the mapping table 121 may be updated to store a physical address of the first type area 111. Afterwards, if the program operation of the second type area 113 ends, the mapping table 121 may be updated to store a physical address of the second type area 113.

When the program operation of the first type area 111 does not end prior to the program operation of the second type area 113, in an operation S560, the mapping table 121 may be updated when the program operation of the second type area 113 ends. Afterwards, when the program operation of the first type area 111 ends, the mapping table 121 may not be updated.

Figure 30:
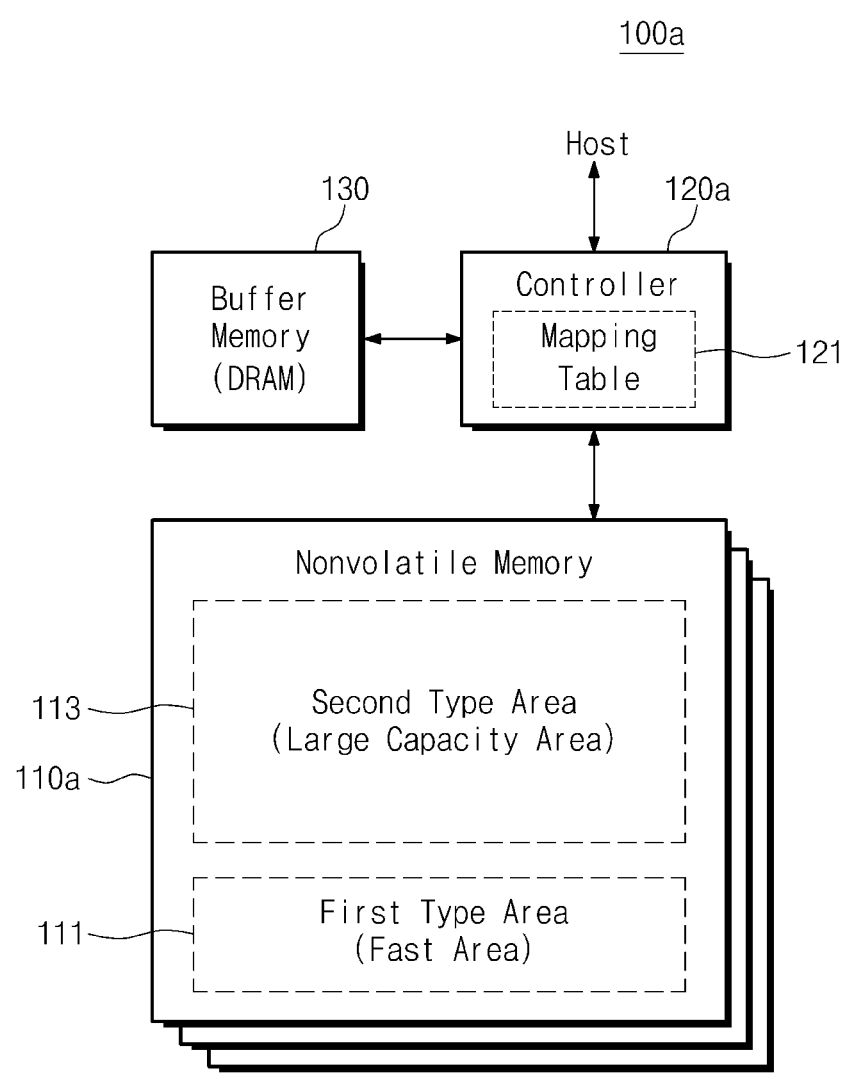
FIG. 30 is a block diagram schematically illustrating a memory system according to another embodiment of the present inventive concept.

FIG. 30 is a block diagram schematically illustrating a memory system 100*a* according to another embodiment of the present inventive concept. Referring to FIG. 30, the memory system 100*a* may include a nonvolatile memory 110*a*, a controller 120*a*, and the buffer memory 130.

As compared to the memory system 100 illustrated in FIG. 1, the nonvolatile memory 110*a* may include a plurality of nonvolatile memory chips. The nonvolatile memory chips may communicate with the controller 120*a* through a common channel. Each of the nonvolatile memory chips may include the first type area 111 and the second type area 113.

Figure 31:
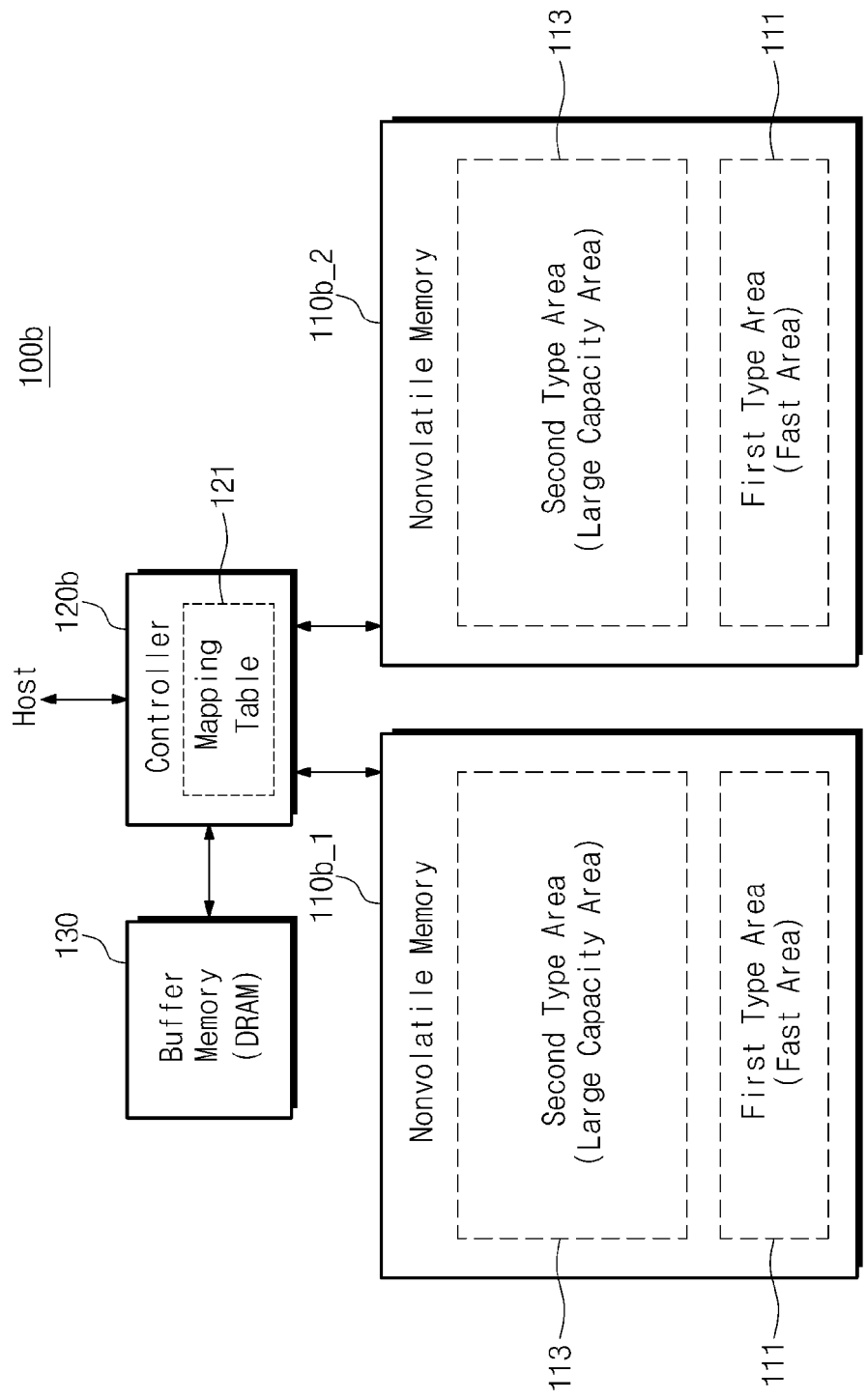
FIG. 31 is a block diagram schematically illustrating a memory system according to still another embodiment of the present inventive concept.

FIG. 31 is a block diagram schematically illustrating a memory system 100*b* according to still another embodiment of the present inventive concept. Referring to FIG. 31, the memory system 100*b* may include nonvolatile memories 110*b*_1 and 110*b*_2, a controller 120*b*, and the buffer memory 130.

As compared to the memory system 100 illustrated in FIG. 1, a plurality of nonvolatile memories 110*b*_1 and 110*b*_2 may be provided. The nonvolatile memories 110*b*_1 and 110*b*_2 may communicate with the controller 120*b* through different channels. Each of the nonvolatile memories 110*b*_1 and 110*b*_2 may include the first type area 111 and the second type area 113.

Figure 32:
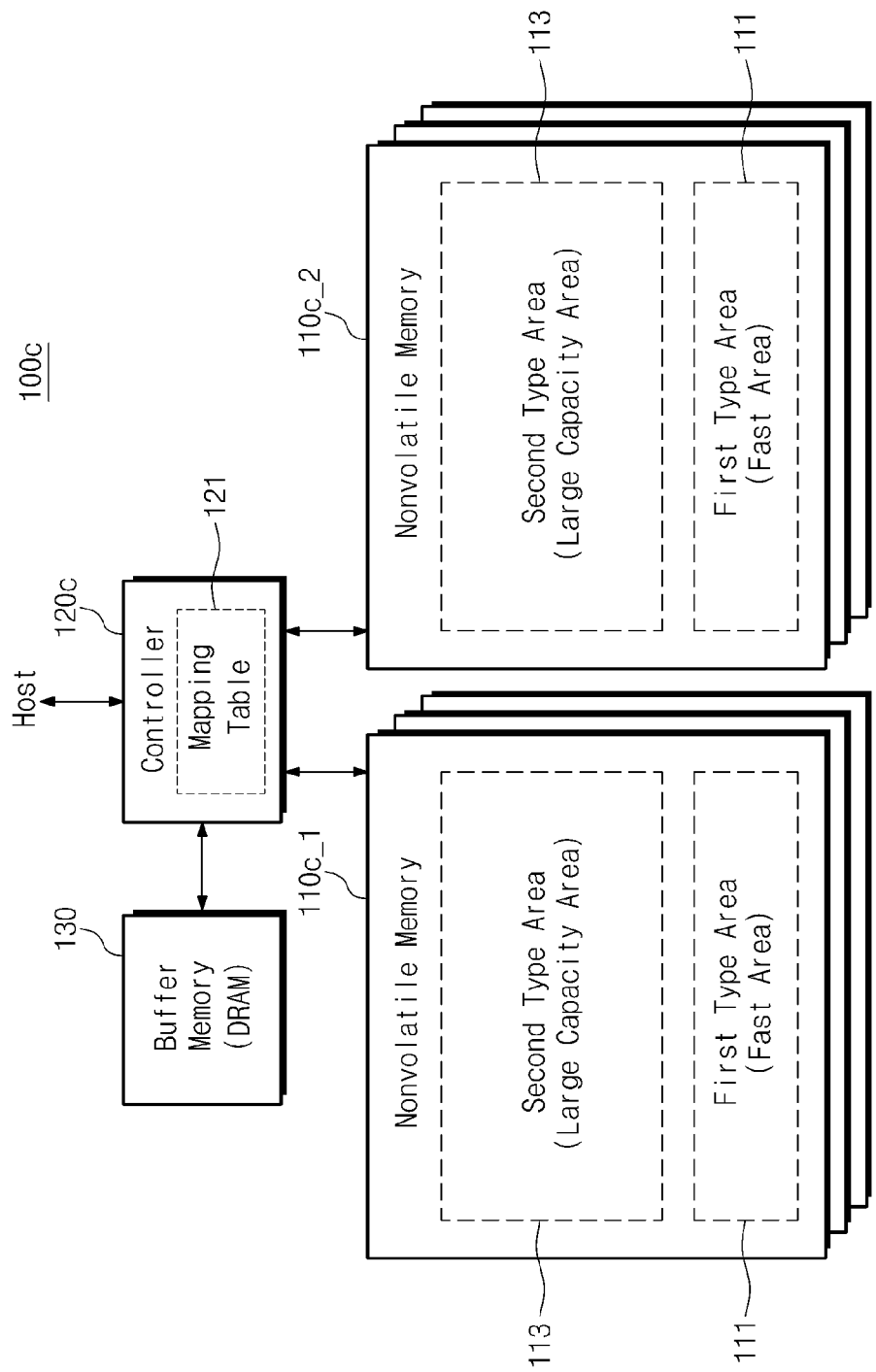
FIG. 32 is a block diagram schematically illustrating a memory system according to yet another embodiment of the present inventive concept.

FIG. 32 is a block diagram schematically illustrating a memory system 100*b* according to yet another embodiment of the present inventive concept. Referring to FIG. 32, the memory system 100*c* may include nonvolatile memories 110*c*_1 and 110*c*_2, a controller 120*c*, and the buffer memory 130.

As compared to the memory system 100*b* illustrated in FIG. 31, each of the nonvolatile memories 110*c*_1 and 110*c*_2 may include a plurality of nonvolatile memory chips. Each of the nonvolatile memories 110*c*_1 and 110*c*_2 may include the first type area 111 and the second type area 113.

Figure 33:
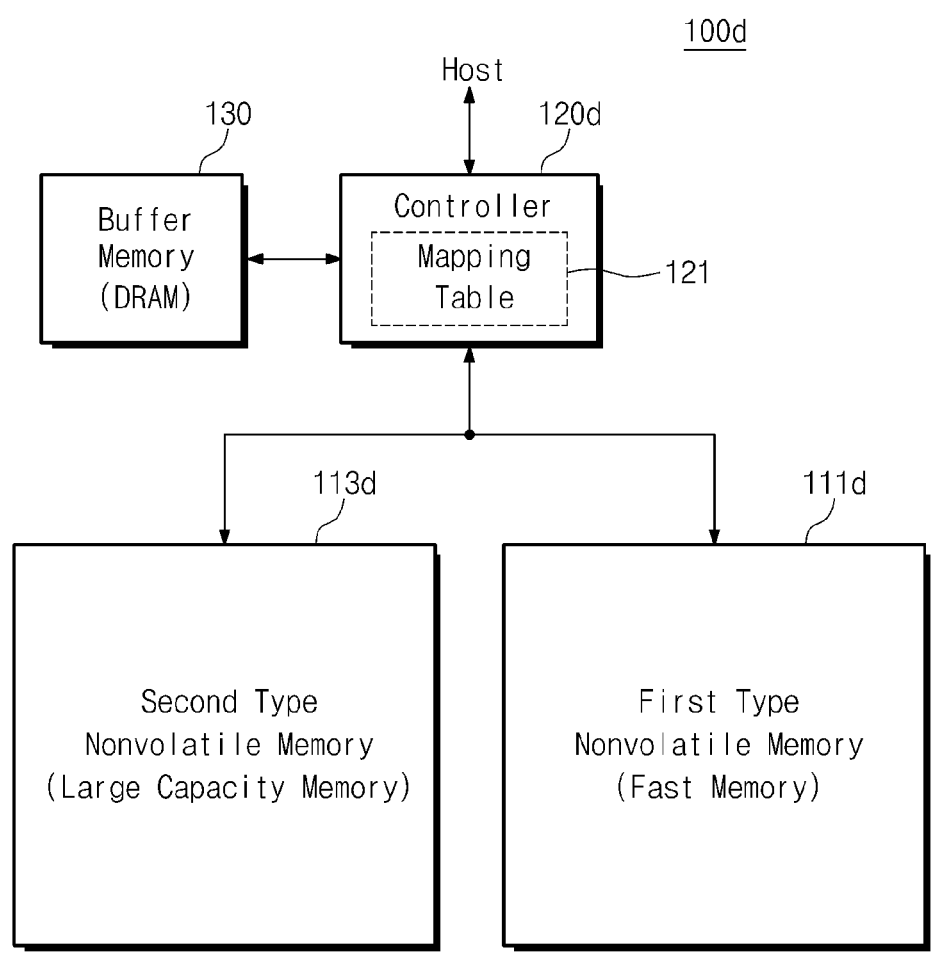
FIG. 33 is a block diagram schematically illustrating a memory system according to still another embodiment of the present inventive concept.

FIG. 33 is a block diagram schematically illustrating a memory system 100*d* according to still another embodiment of the present inventive concept. Referring to FIG. 33, the memory system 100*d* may include nonvolatile memories 113*d* and 111*d*, a controller 120*d*, and the buffer memory 130.

As compared to the memory system 100 illustrated in FIG. 1, the nonvolatile memory 111*d* may be a first type nonvolatile memory. The nonvolatile memory 111*d* may be a fast memory. The nonvolatile memory 113*d* may be a second type nonvolatile memory. The nonvolatile memory 113*d* may be a large capacity memory. The first type area 111 and the second type area 113 described with reference to FIG. 1 may be formed of separate nonvolatile memories, respectively.

The nonvolatile memories 113*d* and 111*d* may communicate with the controller 120*d* through a common channel. Each of the nonvolatile memories 113*d* and 111*d* may include, for example, a plurality of nonvolatile memory chips.

Figure 34:
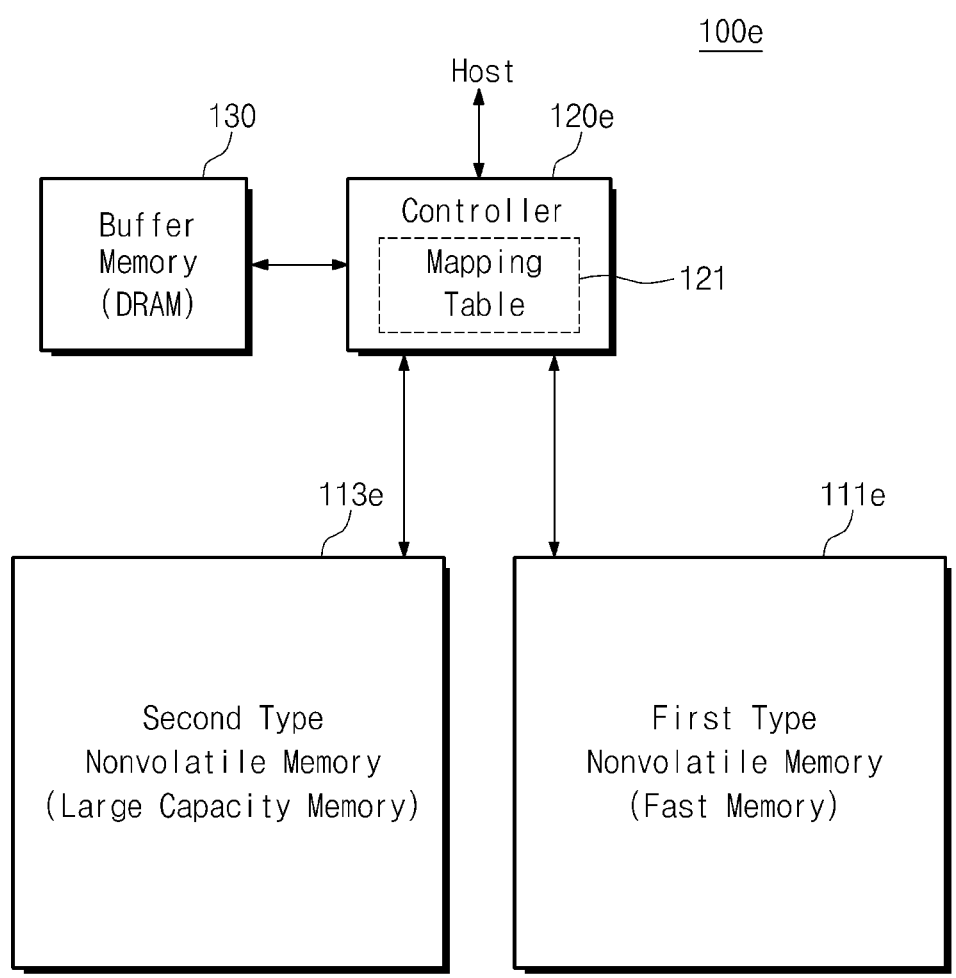
FIG. 34 is a block diagram schematically illustrating a memory system according to another embodiment of the present inventive concept.

FIG. 34 is a block diagram schematically illustrating a memory system 100*e* according to another embodiment of the present inventive concept. Referring to FIG. 34, the memory system 100*e* may include nonvolatile memories 113*e* and 111*e*, a controller 120*e*, and the buffer memory 130.

As compared to the memory system 100*d* illustrated in FIG. 33, the nonvolatile memories 113*e* and 111*e* may communicate with the controller 120*d* through separate channels. Each of the nonvolatile memories 113*e* and 111*e* may include a plurality of nonvolatile memory chips.

Figure 35:
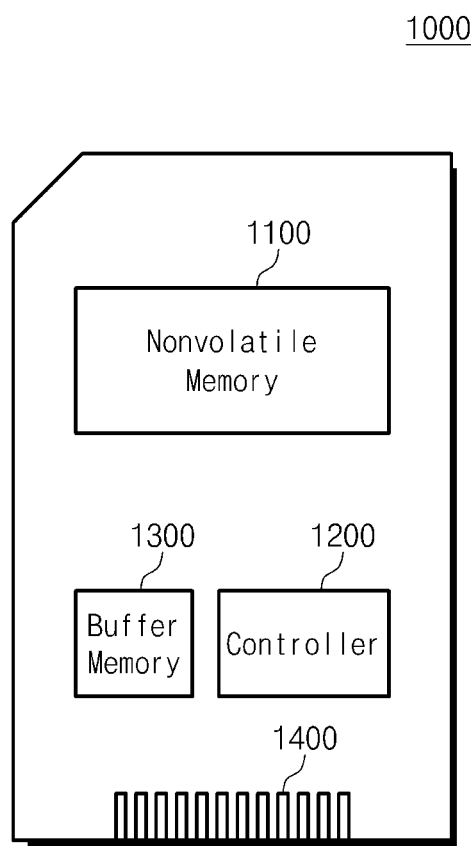
FIG. 35 includes a diagram that illustrates a memory card according to an embodiment of the present inventive concept.

FIG. 35 includes a diagram that illustrates a memory card 1000 according to an embodiment of the present inventive concept. Referring to FIG. 35, the memory card 1000 may include a nonvolatile memory 1100, a controller 1200, a buffer memory 1300, and a connector 1400.

The nonvolatile memory 1100 may include a first type area (not illustrated) configured as a fast area and a second type area (not illustrated) configured as a large capacity area. The memory card 1000 may include a memory system according to an embodiment of the present inventive concept.

The memory card 1000 may be formed as memory cards such as, for example, a Personal Computer Memory Card International Association (PCMCIA) card, a CompactFlash (CF) card, a SmartMedia (SM) card, a memory stick, a multimedia card (MMC), a Reduced Size MMC (RS-MMC), a micro-size MMC (MMCmicro), a security card (Secure Digital (SD), a mini size SD (miniSD), a micro size SD (microSD), a Secure Digital High Capacity (SHC)), a universal flash storage (UFS) device, and the like.

Figure 36:
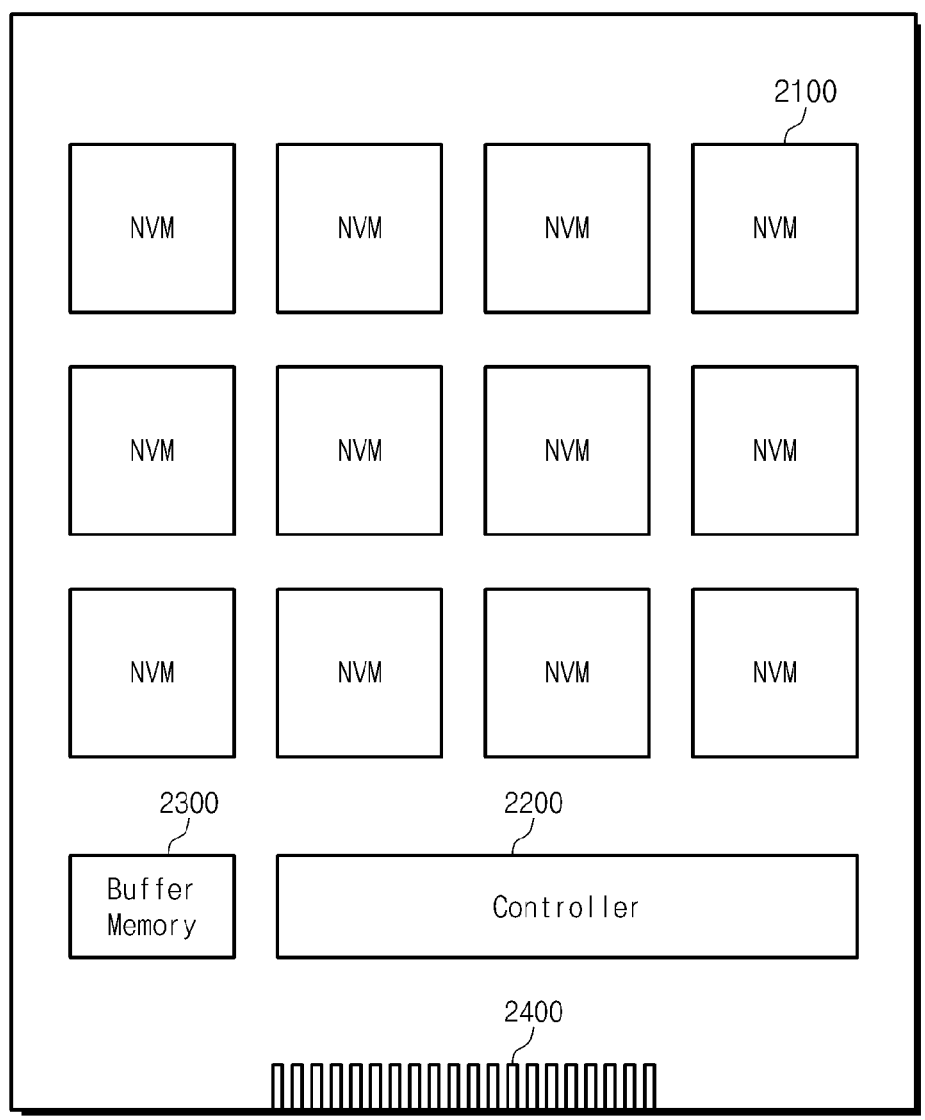
FIG. 36 includes a diagram that illustrates a solid state drive according to an embodiment of the present inventive concept.

FIG. 36 includes a diagram that illustrates a solid state drive (SSD) 2000 according to an embodiment of the present inventive concept. Referring to FIG. 36, the solid state drive 2000 may include a plurality of nonvolatile memories 2100, a controller 2200, a buffer memory 2300, and a connector 2400.

The nonvolatile memory 2100 may include a first type area (not illustrated) configured as a fast area and a second type area (not illustrated) configured as a large capacity area. The SSD 2000 may include a memory system according to an embodiment of the present inventive concept.

Figure 37:
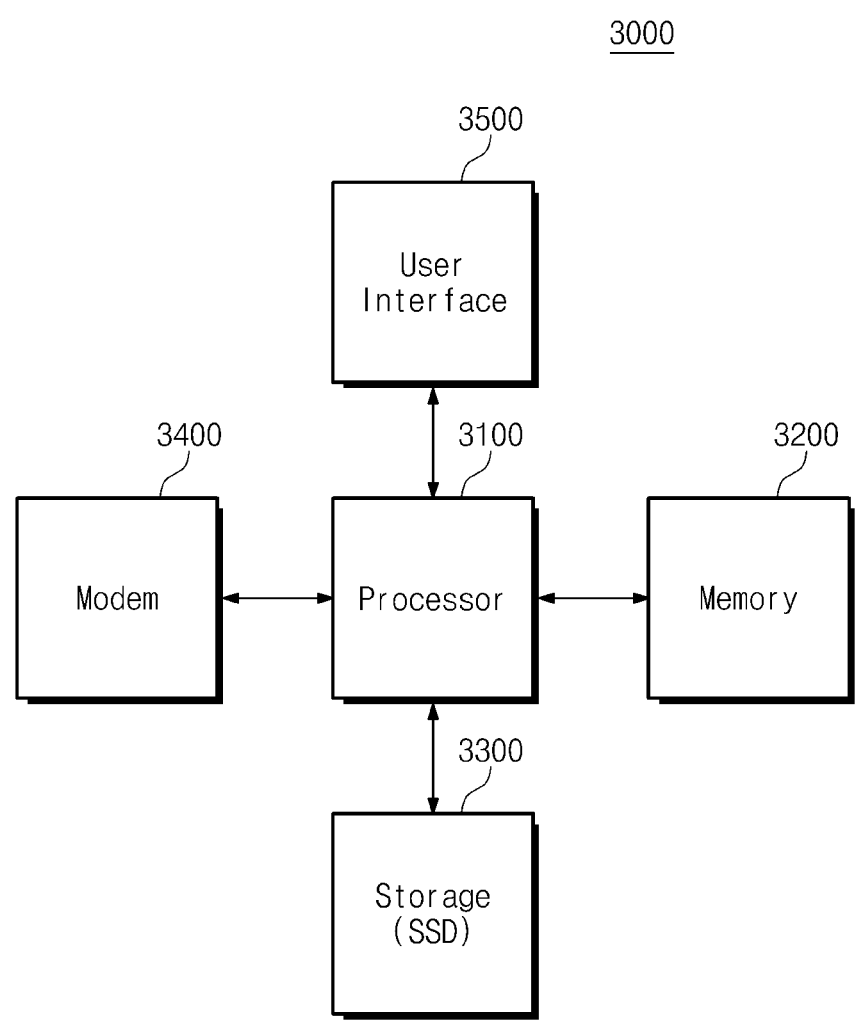
FIG. 37 is a block diagram schematically illustrating a computing device according to an embodiment of the present inventive concept.

FIG. 37 is a block diagram schematically illustrating a computing device 3000 according to an embodiment of the present inventive concept. Referring to FIG. 37, the computing device 3000 may include a processor 3100, a memory 3200, a storage 3300, a modem 3400, and a user interface 3500.

The processor 3100 may control an overall operation of the computing device 3000, and may perform a logical operation. The processor 3100 may, for example, be formed as a system-on-chip (SoC). The processor 3100 may, for example, be a general purpose processor or an application processor.

The memory 3200 may communicate with the processor 3100. The memory 3200 may be a working memory (or, a main memory) of the processor 3100 or the computing device 3000. The memory 3200 may include a volatile memory such as, for example, a static random-access memory (RAM), a dynamic RAM (DRAM), a synchronous DRAM, etc. or a nonvolatile memory such as, for example, a flash memory, a Phase-change RAM (PRAM), a Magnetic RAM (MRAM), a Resistive RAM (RRAM), a Ferroelectric RAM (FRAM), etc.

The storage 3300 may be a main storage of the computing system 3000. The storage 3300 may be used to store data for a long time. The storage 3300 may include a hard disk drive or a nonvolatile memory such as, for example, a flash memory, a PRAM, an MRAM, an RRAM, an FRAM, etc. The storage 3300 may include a memory system according to an embodiment of the present inventive concept.

In example embodiments of the present inventive concept, the memory 3200 and the storage 3300 may be formed as a nonvolatile memory of a same type. In this case, the memory 3200 and the storage 3300 may be integrated into a semiconductor integrated circuit.

The modem 3400 may communicate with an external device under a control of the processor 3100. For example, the modem 3400 may communicate with the external device in a wire or wireless manner. The modem 3400 may communicate, for example, based on at least one of several wireless communications protocols such as, for example, Long Term Evolution (LTE), Worldwide Interoperability for Microwave Access (WiMax), Global System for Mobile communication (GSM), Code Division Multiple Access (CDMA), Bluetooth, Near Field Communication (NFC), Wireless Fidelity (WiFi), Radio Frequency Identification (RFID), and so on or wire communications protocols such as, for example, Universal Serial Bus (USB), Serial Advanced Technology Attachment (SATA), Small Computer Small Interface (SCSI), Firewire, Peripheral Component Interconnection (PCI), etc.

The user interface 3500 may communicate with a user under a control of the processor 3100. For example, the user interface 3500 may include user input interfaces such as, for example, a keyboard, a keypad, a button, a touch panel, a touch screen, a touch pad, a touch ball, a camera, a microphone, a gyroscope sensor, a vibration sensor, etc. The user interface 3500 may further include user output interfaces such as, for example, a Liquid Crystal Display (LCD), a Light Emitting Diode (LED), an Organic Light Emitting Diode (OLED) display device, an Active Matrix OLED (AMOLED) display device, a speaker, a motor, etc.

The present general inventive concept can also be embodied as computer-readable codes on a computer-readable medium. The computer-readable medium can include a computer-readable recording medium and a computer-readable transmission medium. The computer-readable recording medium is any data storage device that can store data as a program which can be thereafter read by a computer system. Examples of the computer-readable recording medium include read-only memory (ROM), random-access memory (RAM), compact disc ROM (CD-ROMs), magnetic tapes, floppy disks, and optical data storage devices. The computer-readable recording medium can also be distributed over network coupled computer systems so that the computer-readable code is stored and executed in a distributed fashion. The computer-readable transmission medium can be transmitted through carrier waves or signals (e.g., wired or wireless data transmission through the Internet). Also, functional programs, codes, and code segments to accomplish the present general inventive concept can be easily construed by programmers skilled in the art to which the present general inventive concept pertains.

Although a few embodiments of the present inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A method of operating a memory system, comprising:
   receiving first data from an external device, the first data having a logical address;
   storing the first data received from the external device in a buffer memory of the memory system;
   starting a programming of the first data stored in the buffer memory to a second storage area of a nonvolatile memory of the memory system;
   receiving a flush command from the external device;
   in response to receiving the flush command from the external device, starting a programming of the first data stored in the buffer memory to a first storage area of the nonvolatile memory;
   determining if the programming of the first data stored in the buffer memory to the first storage area of the nonvolatile memory is completed prior to the programming of the first data stored in the buffer memory to the second storage area; and
   in response to the determining that the programming of the first data stored in the buffer memory to the first storage area of the nonvolatile memory is not completed prior to the programming of the first data stored in the buffer memory to the second storage area, (a) updating a mapping table to associate the logical address of the first data with a physical address of the second storage area and (b) not updating the mapping table in response to the programming of the first data stored in the buffer memory to the first storage area, and
   in response to the determining that the programming of the first data stored in the buffer memory to the first storage area of the nonvolatile memory is completed prior to the programming of the first data stored in the buffer memory to the second storage area, (a) updating a mapping table to associate the logical address of the first data with a physical address of the first storage area in response to the programming of the first data stored in the buffer memory to the first storage area and (b) updating the mapping table to associate the logical address of the first data with a physical address of the second storage area in response to the programming of the first data stored in the buffer memory to the second storage area.

2. The method of claim 1, wherein the first storage area is configured as a single level cell memory area and the second storage area is configured as a multi-level cell memory area.

3. The method of claim 1, wherein a programming time of the first storage area is faster than a programming time of the second storage area.

4. The method of claim 1, wherein in response to receiving the flush command, the memory system enters into a guarantee mode.

5. The method of claim 4, wherein in response to an end of the programming of the data stored in the buffer memory to the first storage area, the guarantee mode ends.

6. The method of claim 4, wherein the mode of the memory system is set to the guarantee mode in response to a cache off signal being transmitted from the external device.

7. The method of claim 1, wherein during the guarantee mode, data remaining in the buffer memory, other than data associated with programming of the first data stored in the buffer memory to the second storage area, is released from the buffer memory after an end of the programming of the first data stored in the buffer memory to the first storage area of the nonvolatile memory.

8. A memory system, comprising:
   a buffer memory configured to store first data received from an external device, the first data having a logical address;
   a nonvolatile memory including a first storage area and a second storage area; and
   a memory controller configured to initiate a programming of the first data stored in the buffer memory to the second storage area during a first operational mode, and in response to receiving a flush command from the external device, to initiate the programming of the first data stored in the buffer memory to the first storage area in a second operational mode;

wherein the memory controller is configured to monitor a completion of the programming of the first data stored in the buffer memory to the first storage area and monitor a completion of the programming of the first data stored in the buffer memory to the second storage area, wherein, the memory controller is configured to update a mapping table to associate the logical address of the first data with a physical address of the first storage area upon a completion of the programming of the first data to the first storage area and update the mapping table to associate the logical address of the first data with a physical address of the second storage area upon a completion of the programming of the first data to the second storage area in response to determining that the programming of the first data to the first storage area ends prior to the programming of the first data to the second storage area, and wherein, the memory controller, in response to determining that the programming of the first data to the first storage area does not end prior to the programming of the first data to the second storage area, is configured to update a mapping table to associate the logical address of the first data with a physical address of the second storage area upon a completion of the programming of the first data to the second storage area and to not update the mapping table to associate the logical address of the first data with the physical address of the first storage area upon a completion of the programming of the first data to the first storage area.

9. The memory system of claim 8, wherein the first storage area is configured as a single level cell memory area and the second storage area is configured as a multi-level cell memory area.

10. The memory system of claim 8, wherein a programming time of the first storage area is faster than a programming time of the second storage area.

11. The memory system of claim 8, wherein the buffer memory, the nonvolatile memory, and the memory controller constitute a solid state drive.

12. The memory system of claim 8, wherein the buffer memory is a volatile memory.

13. The memory system of claim 8, wherein the first storage area and the second storage area are integrated in the same semiconductor chip.

14. The memory system of claim 8, wherein the first storage area and the second storage area comprise memory cells having the same structure.

15. A memory system, comprising:
a buffer memory configured to store first data received from an external device, the first data having a logical address;

a nonvolatile memory including a first storage area configured to store one bit per memory cell of the first storage area, and a second storage area configured to store more than one bit per memory cell of the second storage area; and a memory controller configured to initiate a programming of the first data stored in the buffer memory to the second storage area and subsequently, in response to receiving a flush command from the external device, to initiate the programming of the first data stored in the buffer memory to the first storage area;

wherein, the memory controller is configured to update a mapping table to associate the logical address of the first data with a physical address of the first storage area upon a completion of the programming of the first data to the first storage area and update the mapping table to associate the logical address of the first data with a physical address of the second storage area upon a completion of the programming of the first data to the second storage area in response to determining that the programming of the first data to the first storage area ends prior to the programming of the first data to the second storage area, and wherein, the memory controller, in response to determining that the programming of the first data to the first storage area does not end prior to the programming of the first data to the second storage area, is configured to update a mapping table to associate the logical address of the first data with a physical address of the second storage area upon a completion of the programming of the first data to the second storage area and to not update the mapping table to associate the logical address of the first data with the physical address of the first storage area upon a completion of the programming of the first data to the first storage area.

16. The memory system of claim 15, wherein the first storage area is configured as a single level cell memory area and the second storage area is configured as a multi-level cell memory area.

17. The memory system of claim 15, wherein a programming time of the first storage area is faster than a programming time of the second storage area.

18. The memory system of claim 15, wherein the buffer memory, the nonvolatile memory, and the memory controller constitute a solid state drive.

19. The memory system of claim 15, wherein the buffer memory is a volatile memory.

20. The memory system of claim 15, wherein the first storage area and the second storage area are integrated in the same semiconductor chip.

21. The memory system of claim 15, wherein the first storage area and the second storage area comprise memory cells having the same structure.

* * * * *